United States Patent
Arai et al.

(10) Patent No.: US 6,344,384 B2
(45) Date of Patent: Feb. 5, 2002

(54) METHOD OF PRODUCTION OF SEMICONDUCTOR DEVICE

(75) Inventors: Chihiro Arai, Kanagawa; Hiroyuki Miwa, Tokyo, both of (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 09/859,635

(22) Filed: May 18, 2001

(30) Foreign Application Priority Data

Jun. 27, 2000 (JP) ......................................... 2000-192966

(51) Int. Cl.⁷ ........................................... H01L 21/8249

(52) U.S. Cl. ........................ 438/234; 438/310; 438/323; 438/302; 438/235

(58) Field of Search ................................. 438/234, 235, 438/310, 312, 323, 302

(56) References Cited

FOREIGN PATENT DOCUMENTS

DE              19742624      *  9/1997  .........  H01L/21/331

* cited by examiner

*Primary Examiner*—Charles Bowers
*Assistant Examiner*—Yennhu B. Huynh

(57) ABSTRACT

A method of production of a semiconductor device able to be miniaturized by preventing the decline of the $h_{fe}$ at a low current caused by an increase of a surface recombination current of a bipolar transistor and forming the external base region by self-alignment with respect to emitter polycrystalline silicon in the BiCMOS process. An intrinsic base region of a first semiconductor element is formed, an insulating film having an opening at an emitter formation region of part of the intrinsic base region is formed, and then an emitter electrode of the first semiconductor element and a protective film are formed on an insulating film having the opening. Next, a sidewall insulating film is left on the gate electrode side portion. Simultaneously, the insulating film is removed while partially leaving the emitter region forming-use insulating film under the emitter electrode. Further, the external base region connected to the intrinsic base region is formed on the semiconductor substrate surface by self-alignment with respect to the emitter electrode.

9 Claims, 23 Drawing Sheets

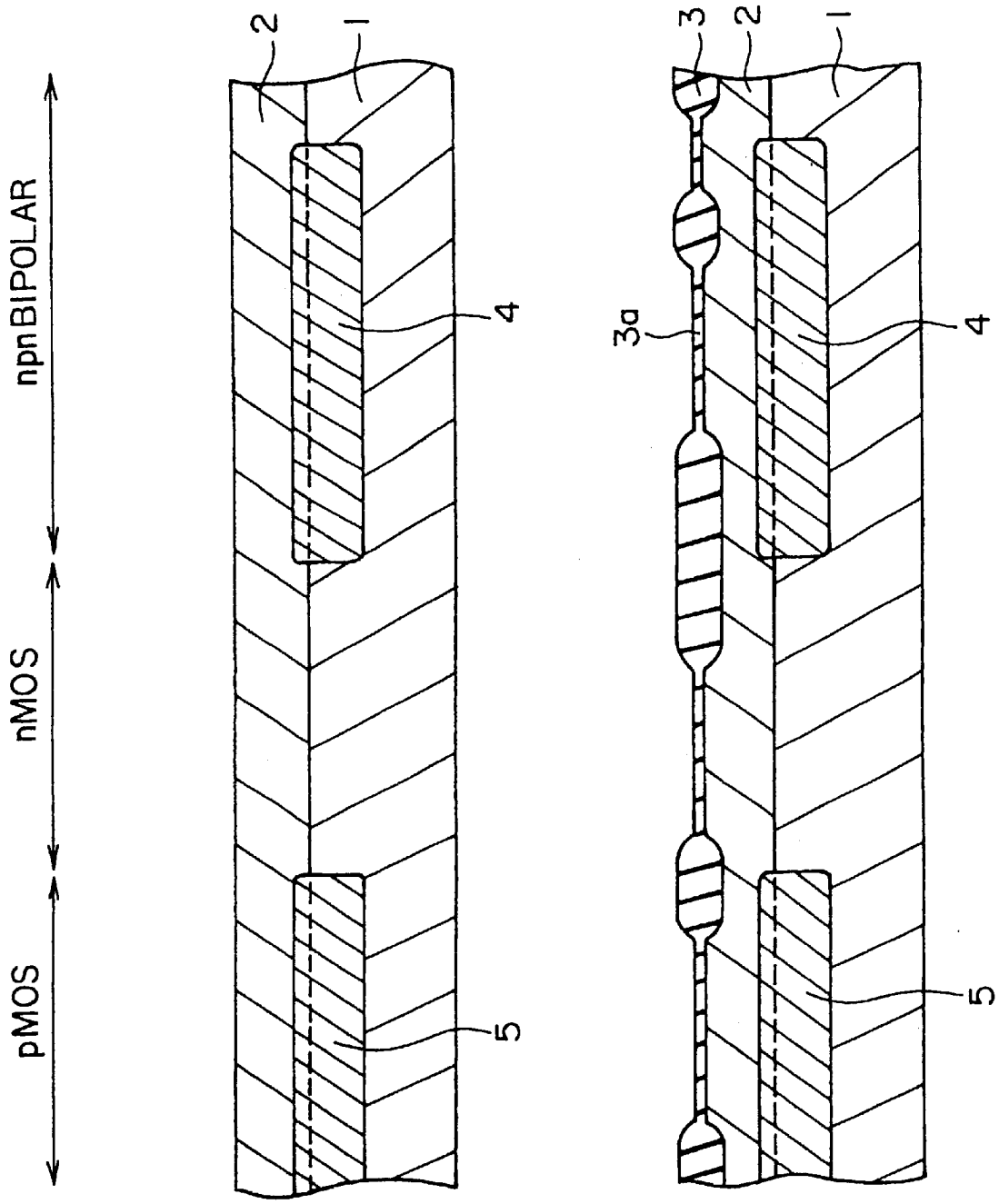

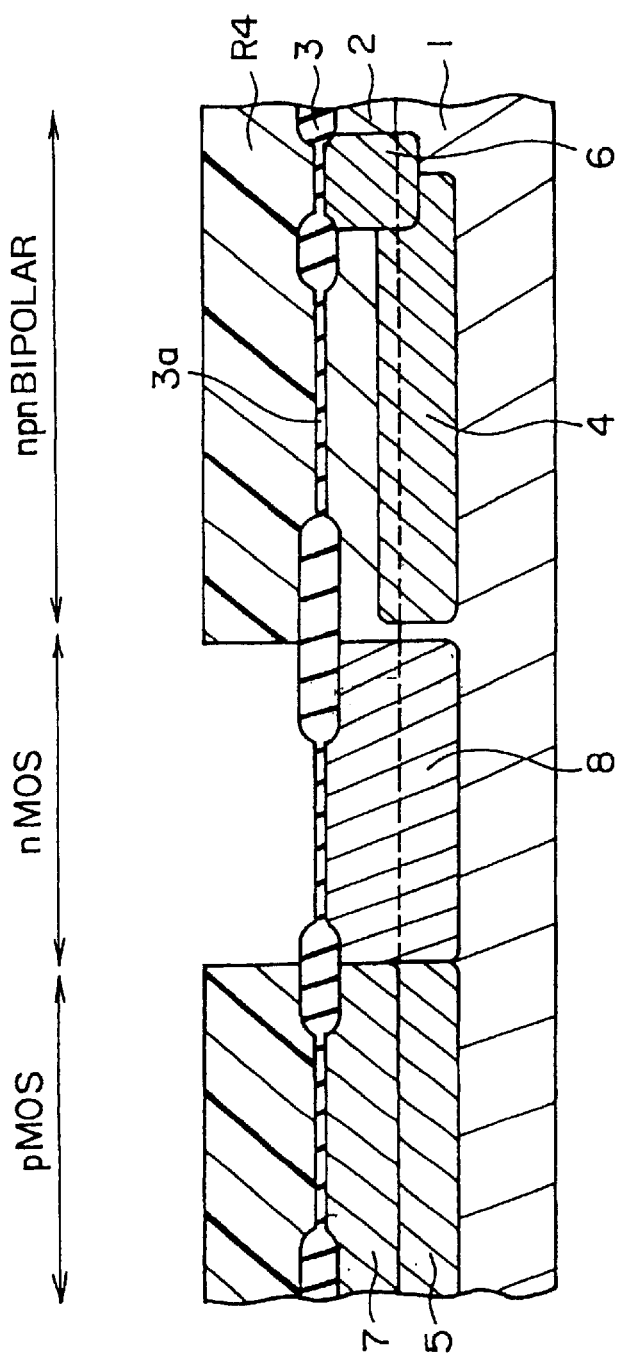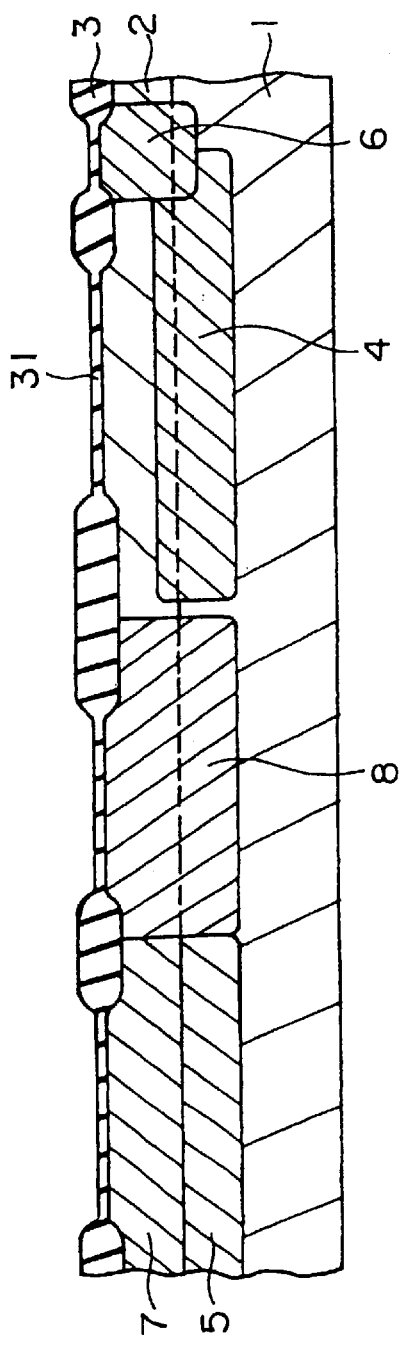
FIG. 5G
FIG. 5H

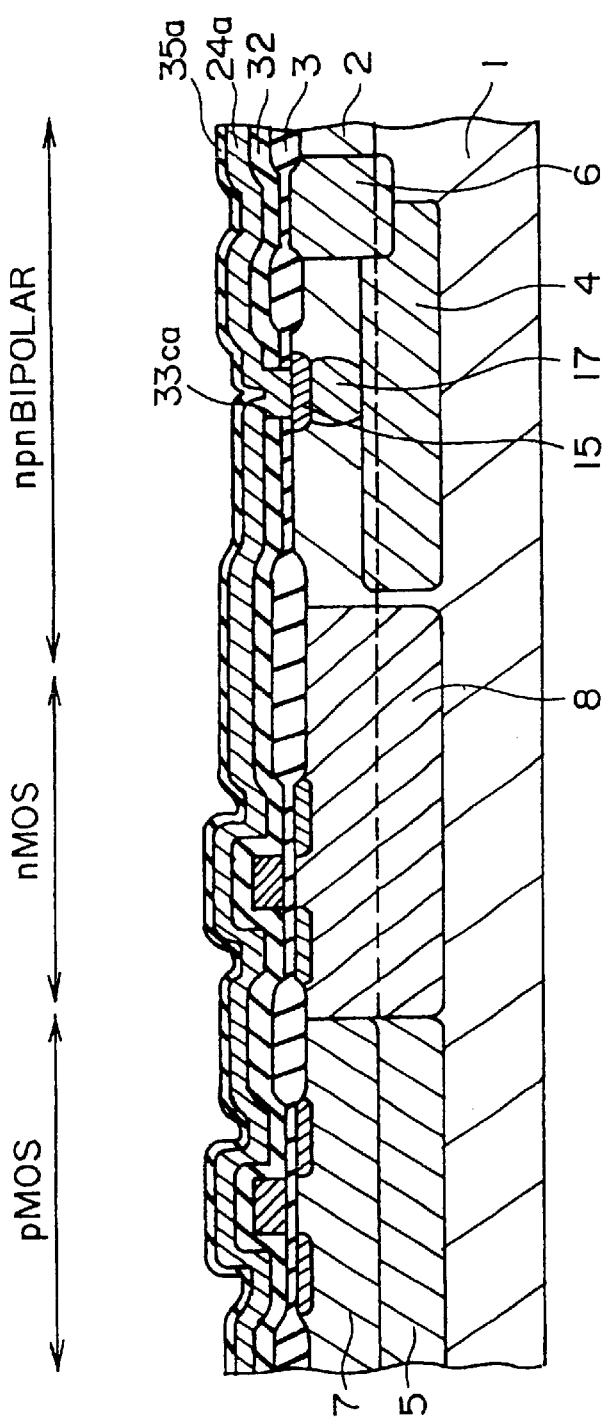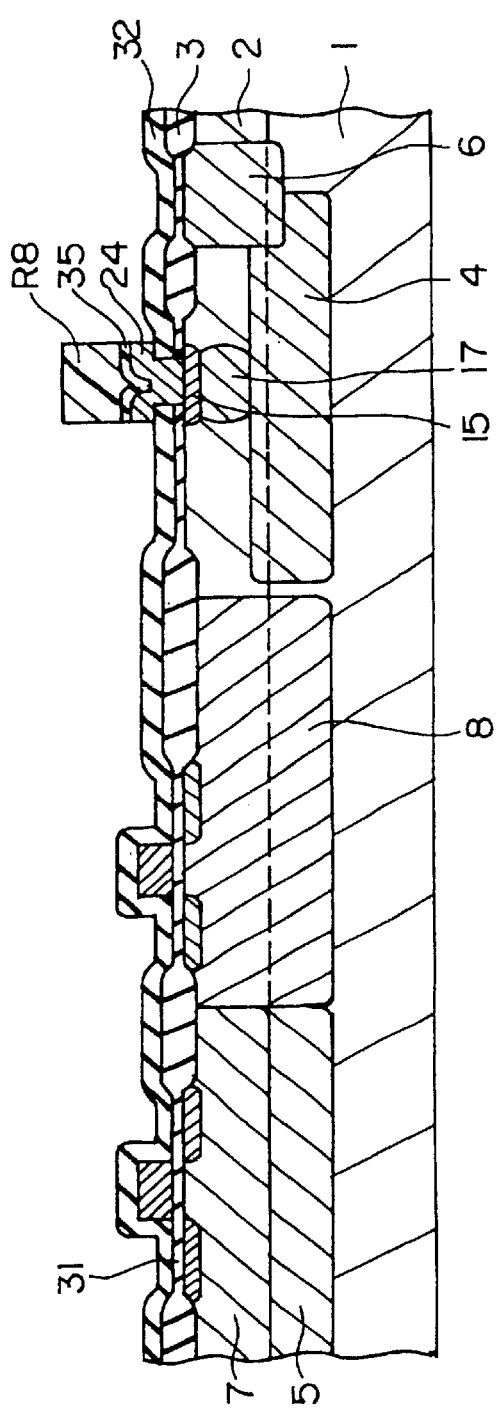
FIG. 9O
FIG. 9P

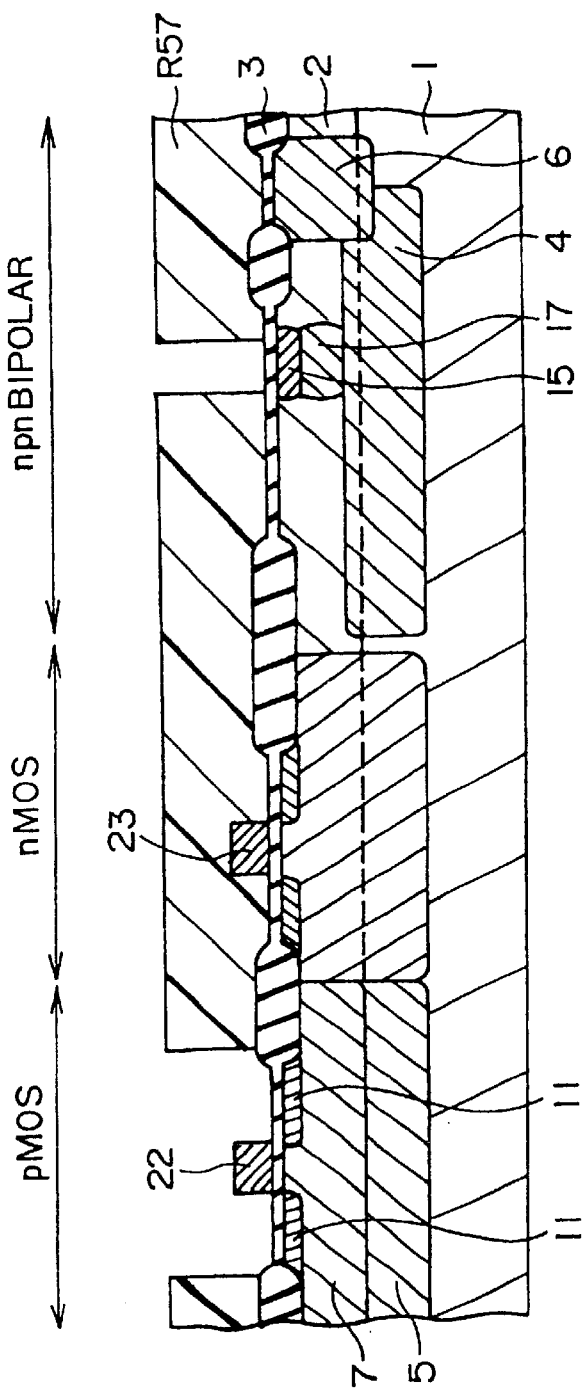
FIG. 12J-L
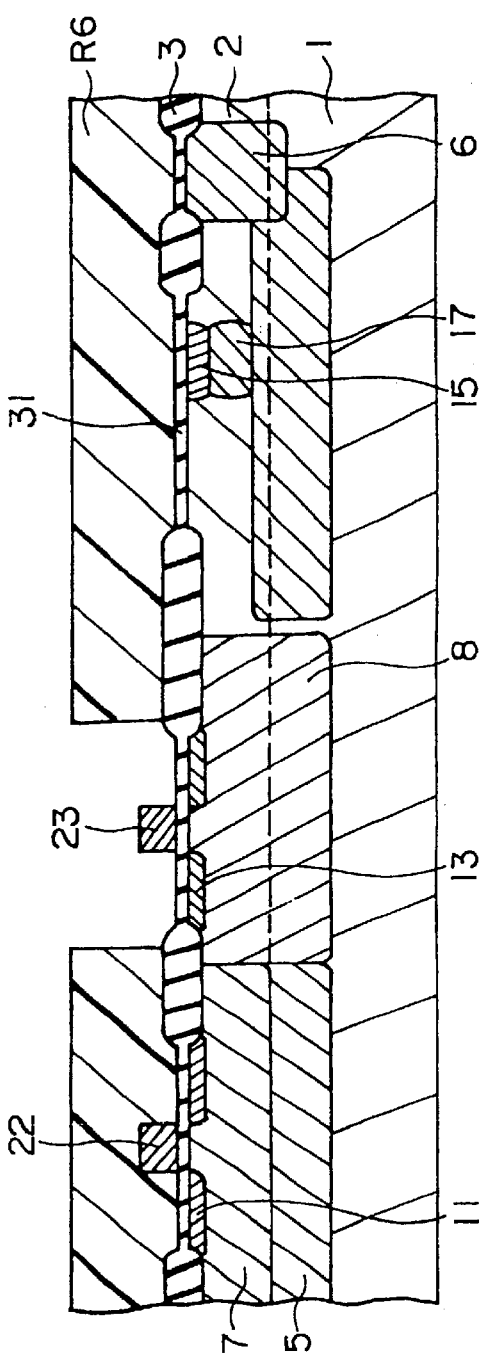
FIG. 12K

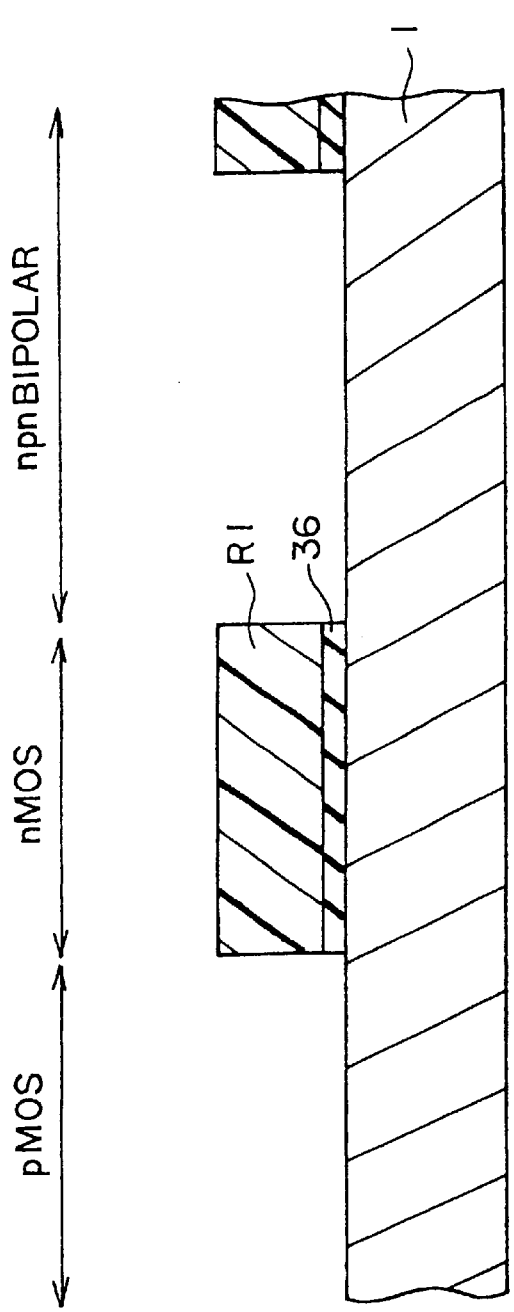
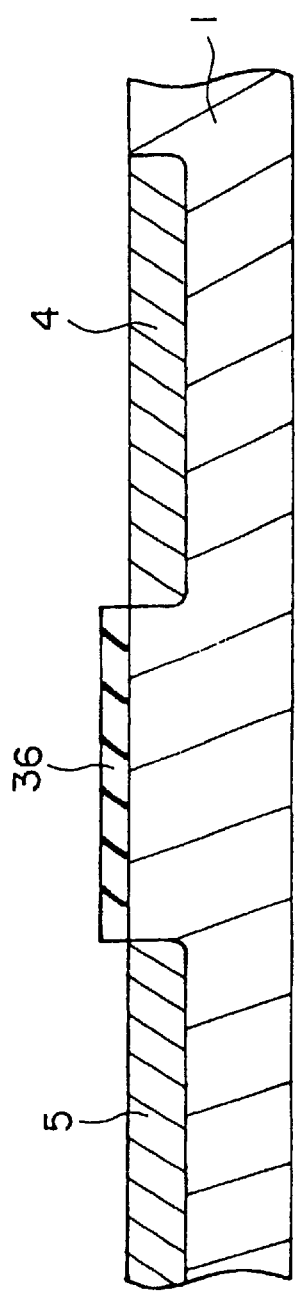
FIG. 14A PRIOR ART
FIG. 14B PRIOR ART

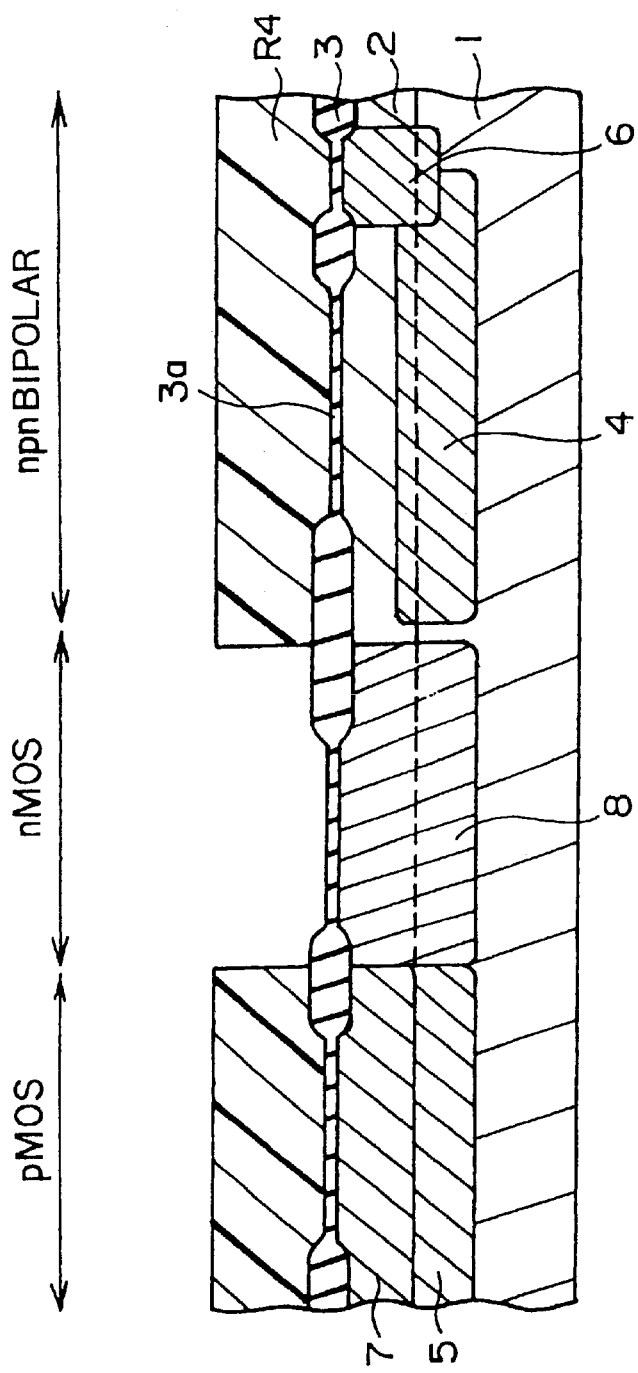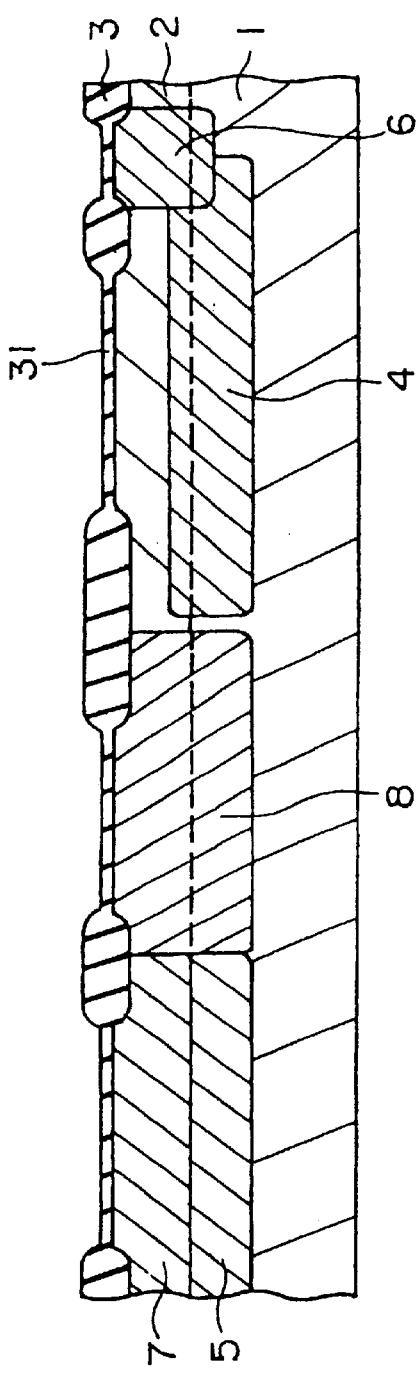
FIG. 17G PRIOR ART
FIG. 17H PRIOR ART

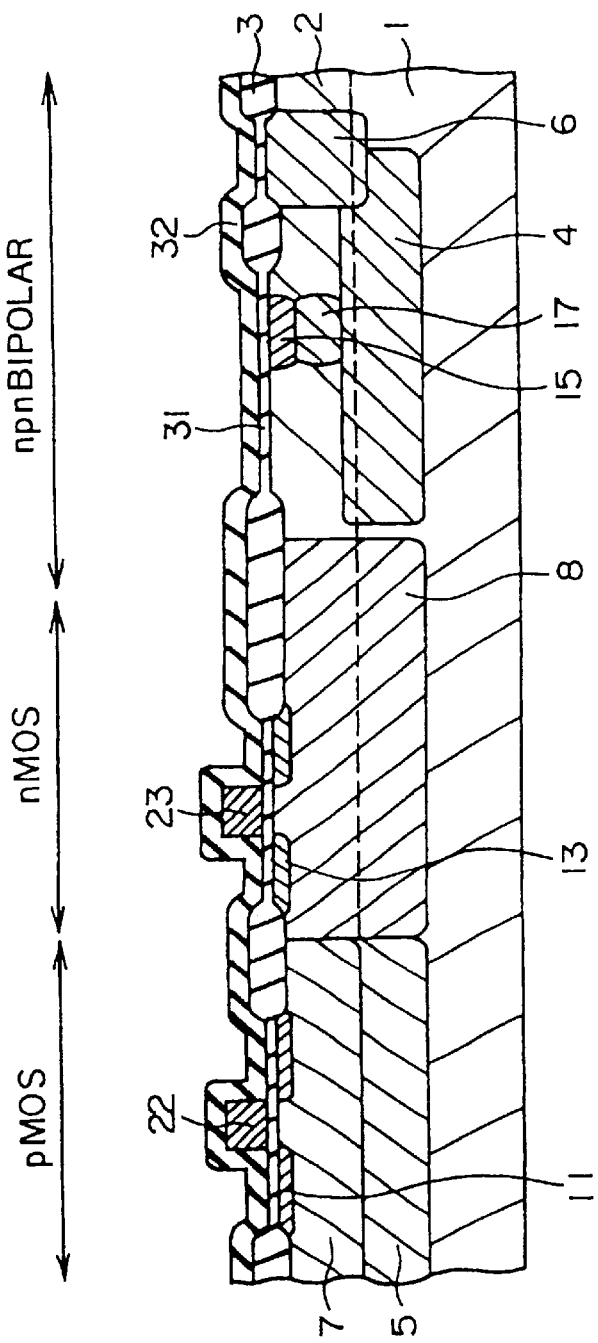
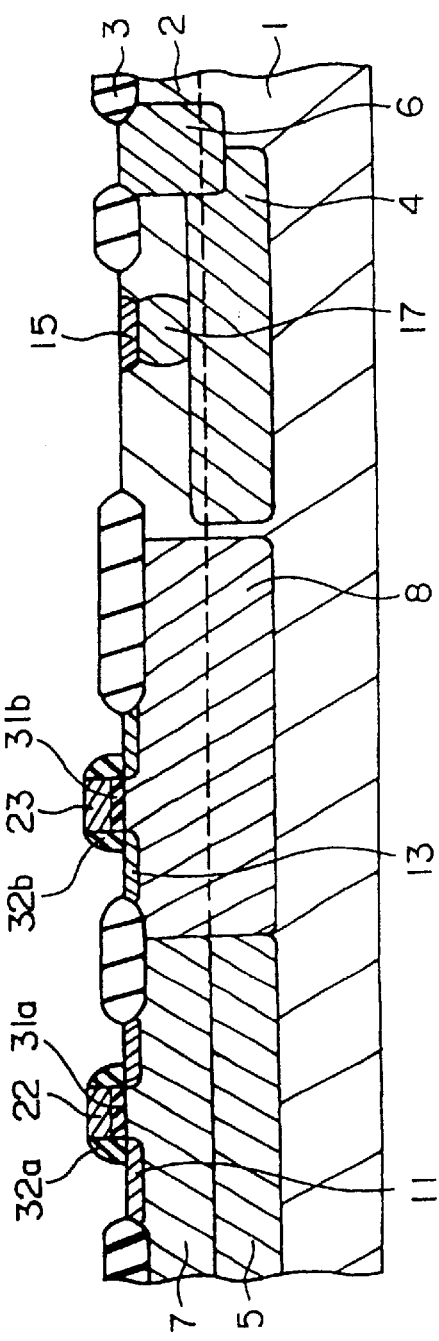
FIG. 20M PRIOR ART
FIG. 20N PRIOR ART

METHOD OF PRODUCTION OF SEMICONDUCTOR DEVICE

BACKGROUND OF THE INVENTION

1. Field of the Invention

The present invention relates to a method of production of a semiconductor device; and, more particularly relates to a method of production of a semiconductor device having a BiCMOS transistor.

2. Description of the Related Art

Along with the increasingly small size and lighter weight of electronic equipment and the reduction of power consumption in recent years, there has been growing demand for higher integration and greater miniaturization of semiconductor devices. Therefore, there has been development of a bipolar CMOS (Bi-CMOS) combining a CMOS having the characteristics of low power consumption and high integration and a bipolar transistor having the characteristics of a strong drive force and high speed.

FIG. 13 is a sectional view of a BiCMOS transistor produced by a method of production of the related art.

As shown in FIG. 13, an n-type epitaxial layer 2 is formed on a p-type semiconductor substrate 1, and an element isolation insulating film 3 is formed by a LOCOS technique on a surface of the n-type epitaxial layer 2.

In an npn bipolar transistor formation region, an n-type collector burying region 4 is formed below the n-type epitaxial layer 2 forming an n-type collector region, and a selective-ion-implantation-of-collector (SIC) region 17 for increasing the concentration of impurity directly below a base is formed above the n-type collector burying region 4.

An intrinsic base region 15 containing a p-type impurity and an external base region 16 for taking out a base containing a p-type impurity of a higher concentration than that in the intrinsic base region 15 and reduced in resistance are formed connected on the surface of the n-type epitaxial layer 2.

A silicon oxide film 33 is formed on the p-type base regions (15 and 16). Emitter polycrystalline silicon 24 is formed in an opening 33a formed in the silicon oxide film 33 and on the silicon oxide film 33. An n-type emitter region 25 is formed on the surface of the intrinsic base region 15 below the emitter polycrystalline silicon 24.

Also, an n-type collector plug region 6 and an n-type collector take-out region 6a are formed on a part of the n-type epitaxial layer 2 on the n-type collector burying region 4 over the p-type base regions (15 and 16).

An n-type isolation region 5 for isolation from the p-type semiconductor substrate 1 is formed on a pMOS transistor formation region. Further, an n-type well 7 is formed in the n-type epitaxial layer 2. Further, a p-type well 8 is formed in the nMOS transistor region.

In the pMOS and the nMOS transistor formation regions, source/drain regions (12 and 14) having LDD regions (11 and 13) are formed on the surfaces of the n-type well 7 and the p-type well 8, respectively.

Also, gate electrodes (22 and 23) are formed between the source/drain regions (12 and 14) via the gate oxide films (31a and 31b). Sidewall insulating films (32a and 32b) are formed on the side portions of the gate electrodes (22 and 23).

A silicon oxide film 33 is formed covering the entire surfaces of the gate electrodes (22 and 23). An interlayer insulating film 34 is formed covering the entire surfaces of the transistors, contact holes (41, 42, 43, 44, 45, 46, and 47) reaching the source/drain regions (12 and 14) of the pMOS and nMOS transistors, the external base region 16 and an emitter electrode 24 of the npn bipolar transistor. A collector take-out region 6a is formed in the silicon oxide film 33 and the interlayer insulating film 34. Interconnection layers (51, 52, 53, 54, 55, 56, and 57) are formed inside and over the contact holes.

An example of a method of production of the semiconductor device having the above configuration will be explained next.

First, as shown in FIG. 14A, for example, a p-type silicon semiconductor substrate 1 is oxidized by thermal oxidation to form an oxide film on the surface. On the upper surface of the oxide film, a resist film R1 of a pattern having openings at the npn bipolar transistor formation region and the pMOS transistor formation region on the above silicon semiconductor substrate 1 is formed by lithography.

Then, the oxide film is patterned by using the resist film R1 as a mask, so as to form an oxide film 36 having openings at the npn bipolar transistor formation region and the pMOS transistor formation region.

Next, as shown in FIG. 14B, the resist film R1 is removed and antimony is diffused in the silicon semiconductor substrate 1 through the openings formed in the above oxide film 36 by thermal diffusion using a solid source of antimony oxide ($Sb_2O_3$) so as to form, for example, an n-type collector burying region 4 and an n-type isolation region 5 for isolation from the p-type semiconductor substrate 1.

Next, as shown in FIG. 15C, the oxide film 36 is removed by, for example, wet etching, and then an n-type epitaxial layer 2 is formed on the silicon semiconductor substrate 1 by epitaxial growth.

Next, as shown in FIG. 15D, an element isolation insulating film 3 is formed on the n-type epitaxial layer 2 by a LOCOS process.

In the process of forming the element isolation insulating film 3, for example, a silicon oxide film 3a is formed by thermal oxidation on the surface of the n-type epitaxial layer 2, a not illustrated silicon nitride film is formed on regions other than the element isolation insulating film formation region on the silicon oxide film 3a and the surface of the n-type epitaxial layer 2 is thermally oxidized using the silicon nitride film as an oxidation resistant mask to form the element isolation insulating film 3. Then, the silicon nitride film is removed by etching.

Next, as shown in FIG. 16E, a resist film R2 having an opening at a region for forming an n-type collector plug region on the npn bipolar transistor formation region is formed. The resist film R2 is used as a mask and, for example, the n-type impurity phosphorus is implanted, so as to form an n-type collector plug region 6 connected to the n-type collector burying region 4 on the n-type epitaxial layer 2. Then, the resist film R2 is removed.

Next, as shown in FIG. 16F, a resist film R3 having an opening at the pMOS transistor formation region is formed by lithography on the n-type epitaxial layer 2. An n-type impurity, for example, phosphorus, is implanted to form an n-type well 7. Then, the resist film 3 is removed.

Next, as shown in FIG. 17G, a resist film R4 having openings at an nMOS transistor formation region and a part of the element isolation region between the nMOS and pMOS transistor and npn bipolar transistor formation regions is formed on the n-type epitaxial layer 2 by lithography. A p-type impurity boron is then, for example, implanted to form a p-type well using the element isolation region.

Next, as shown in FIG. 17H, the resist film R4 is removed. Then, the oxide film 3a is removed for example by wet etching, and a gate oxide film 31 is formed, for example, by thermal oxidation.

Next, as shown in FIG. 18I, gate electrodes (22 and 23) are formed on the nMOS and pMOS transistor formation regions.

Next, as shown in FIG. 18J, a resist film R5 having an opening at the pMOS formation region is formed by lithography. The resist film R5 is used as a mask for ion implantation of a p-type impurity, for example, boron difluoride ($BF^{2+}$) to form a p-type LDD region 11 in the n-type wells 7 on the two sides of the gate electrode 22. Then the resist film R5 is removed.

Next, as shown in FIG. 19K, a resist film R6 having an opening at the nMOS transistor formation region is formed by lithography. The resist film R6 is used as a mask for implantation of an n-type impurity, for example, arsenic ($As^+$) to form an n-type LDD region 13 in the p-type wells 8 on the two sides of the gate 23. Then, the resist film R6 is removed.

Next, as shown in FIG. 19L, a resist film R7 having an opening at the intrinsic base formation region of the npn bipolar transistor is formed by lithography. The resist film R7 is used as a mask for ion implantation of an n-type impurity, for example, boron difluoride to form an intrinsic base region 15.

Furthermore, by using the resist R7 as a mask for ion implantation of an n-type impurity of, for example, phosphorus, an SIC region 17 for increasing the concentration of the collector impurity immediately below the base is formed. Then, resist film R7 is removed.

Next, as shown in FIG. 20M, a sidewall insulating film 32 is formed by covering the transistors and depositing silicon oxide on the entire surface by CVD.

Next, as shown in FIG. 20N, the sidewall insulating film 32 is removed by etching, for example, by reactive ion etching (RIE) and the sidewall insulating films (32a and 32b) are formed on the side portions of the gate electrodes (22 and 23).

Then, as shown in FIG. 21O, a resist film R8 having openings at the nMOS transistor region and the collector take-out region of an npn bipolar transistor is formed by lithography. This is used as a mask for ion implantation of an n-type impurity of, for example, arsenic to form the source/drain region 14 of the nMOS transistor and the collector take-out region 6a of the npn bipolar transistor. Then, the resist film R8 is removed.

Next, as shown in FIG. 21P, a resist film R9 having openings at the pMOS transistor formation region and the external base formation region of the npn bipolar transistor is formed by lithography. This is used as a mask for ion implantation of a p-type impurity of, for example, boron difluoride to form a source/drain region 12 of the pMOS transistor and an external base region 16 of the npn bipolar transistor. Then, the resist film R9 is removed.

Next, as shown in FIG. 22Q, a silicon oxide film 33 is deposited on the entire surface, a resist film R10 having an opening at the emitter formation region is formed by lithography on the silicon oxide film 33, and the resist film R10 is used as a mask to form an emitter formation opening 33a in the silicon oxide film 33. Then, the resist film R10 is removed.

Next, as shown in FIG. 22R, an emitter polycrystalline silicon-use layer 24a doped with an n-type impurity arsenic to a high concentration for forming the emitter polycrystalline silicon is formed on the entire surface, including the inside of the opening 33a, by low pressure chemical vapor deposition (LPCVD).

Next, as shown in FIG. 23S, a resist film R11 having a pattern of the emitter polycrystalline silicon of the npn bipolar transistor is formed by lithography on the emitter polycrystalline silicon-use layer 24a. The resist film R11 is used as a mask for etching the emitter polycrystalline silicon-use layer 24a to form the emitter polycrystalline silicon 24. Then, the resist film R11 is removed.

Next, as shown in FIG. 23T, for example, rapid thermal annealing (RTA) is performed so as to activate the impurities introduced in the source/drain regions (12 and 14) of the pMOS and nMOS transistors. Also, by heat treatment, the impurities are diffused in the p-type intrinsic base region 15 via the opening 33a from the emitter polycrystalline silicon 24 to the silicon oxide film 33 to form an n-type emitter region 25.

After that, borophosphosilicate glass (BPSG) is deposited on the entire surface to form an interlayer insulating film 34.

A not shown resist film is formed on the interlayer insulating film 34. By using the resist film as a mask, openings (41 and 42) reaching the source/drain regions 12 of the pMOS transistor, openings (43 and 44) reaching the source/drain regions 14 of the nMOS transistor, an opening 45 reaching the external base region 16 of the npn bipolar transistor, an opening 46 reaching the emitter polycrystalline silicon 24, and an opening 47 reaching the collector take-out region 6a are formed in the interlayer insulating film 34 and the silicon oxide film 33.

In the processes thereafter, not shown tungsten plugs are formed by depositing tungsten inside the openings (41 to 47). Via the tungsten plugs, interconnections (51 and 52) connected to the source/drain regions 12 of the pMOS transistor, interconnections (53 and 54) connected to the source/drain regions 14 of the nMOS transistor, an interconnection 56 connected to the emitter polycrystalline silicon 24, and an interconnection 57 connected to the collector take-out region 6a are formed so as to obtain the semiconductor device shown in FIG. 13.

In the method of production of a semiconductor device having a BiCMOS according to the above related art, as shown in FIG. 20N, the sidewall insulating films (32a and 32b) of the nMOS and pMOS transistors are formed by removing the sidewall insulating films 32 by RIE. At this time, since the silicon portion (epitaxial layer 2) is exposed at other than regions of the element isolation insulating film 32 and regions of the gate electrodes (22 and 23), the silicon portion is damaged by the RIE.

At the pMOS and nMOS transistor formation regions, at the time of forming the sidewall insulating film, the silicon portion is exposed at the source/drain regions. Since the source/drain regions are regions where highly concentrated impurities are introduced, the effect due to the exposure of the silicon portion is small.

However, in the bipolar transistor formation region, since the emitter region is formed at the region where the silicon portion is exposed, there is the disadvantage that the reliability declines due to a reduction of the current amplification factor $h_{FE}$ at a low current along with an increase of the surface recombination current.

The decrease of the $h_{FE}$ at a low current due to an increase of the surface recombination current on the bipolar transistor region is generally known. The surface recombination current is caused by the recombination of carriers via a surface energy level generated by crystal discontinuity on the substrate surface and other defects; thus, it is considerably affected by the processing state of the surface.

Accordingly, it is important that no RIE damage occur in the emitter formation region for forming the active region of the bipolar transistor and between the emitter and the p-type external base region.

Also, in the related art, as shown in FIG. 22Q, in the process for forming an opening in the silicon oxide film 33 by the resist film RIO in order to form emitter polycrystalline silicon, it is necessary to consider the alignment of the opening 33a for formation of the emitter region 25 with the external base regions 16 on the left and the right.

Namely, when the distance between the emitter region 25 and the external base regions 16 is too short, there are the disadvantages of a decline of voltage resistance and an increase of the junction capacity of the emitter region 25 and the intrinsic and external base regions (15 and 16), while when the distance between the emitter region 25 and the external base regions 16 is too long, an increase of base resistance and other disadvantages are caused. Therefore, optimization of the distance between the emitter region 25 and the external base regions 16 becomes important.

Considering the above disadvantages and the deviation in positioning of the resist film, to secure a certain margin of safety the distance between the emitter region 25 and the external base region 16 is normally made relatively large.

Specifically, for example, in the process for protecting the emitter polycrystalline silicon formation region in FIG. 21P with the resist film R9 and forming the external base region 16, the resist film R9 of the part for protecting the emitter polycrystalline silicon formation region is formed wide, the resist film R10 is positioned with respect to the widely protected region in the process from FIG. 22 on, and the emitter polycrystalline silicon is formed. Since the distance between the emitter region 25 and the external base region 16 becomes relatively large due to the need for this margin, there is a limit to miniaturization of the BiCMOS.

SUMMARY OF THE INVENTION

An object of the present invention is to provide a method of production of a semiconductor device able to be miniaturized by preventing the decline of the hog at a low current caused by an increase of a surface recombination current of the bipolar transistor and forming the external base region by self-alignment with respect to emitter polycrystalline silicon in a BiCMOS process.

To attain the above object, according to the present invention, there is provided a method of production of a semiconductor device forming a first semiconductor element comprising a collector region, an emitter region, and an intrinsic base region on a first region and forming a second semiconductor element comprising source/drain regions and a gate electrode on a second region and a sidewall insulating film on side portions of the gate electrode, including the steps of: forming said collector region on a semiconductor substrate of said first region; forming said gate electrode on a semiconductor substrate of said second region; forming said intrinsic base region on said semiconductor substrate of said first region; forming an insulating film having an opening at an emitter formation region on said intrinsic base region over said semiconductor substrate of said first and second regions; forming an emitter electrode in said opening and near said opening of said insulating film of said first region; forming a protective film for suppressing introduction of impurities to said emitter electrode of said first region; removing said insulating film of said first and second regions while leaving a sidewall insulating film on said gate electrode side portions and emitter region formation insulating film on a part under said emitter electrode by using said emitter electrode as a mask; forming an external base region connected to said intrinsic base region by self-alignment with respect to said emitter electrode over said semiconductor substrate of said first region; forming said source/drain regions on said semiconductor substrate of said second region by using said sidewall insulating film as a mask; and, forming said emitter region connected to said intrinsic base region on said semiconductor substrate of said first region under said opening by diffusing an impurity in said intrinsic base region from said emitter electrode via said opening of said emitter region formation insulating film.

According to the above method, an intrinsic base region is formed, an insulating film having an opening at an emitter formation region on the intrinsic base region is formed, an emitter electrode of a first semiconductor element is formed and a protective film is formed on the insulating film having the opening.

Next, a sidewall insulating film is left on the gate electrode side portion by using the emitter electrode as a mask: and, the insulating films on the first and second regions are removed while leaving the emitter region formation insulating film partially below the emitter electrode.

Next, an external base region connected to the intrinsic base region is formed by self-alignment with respect to the emitter electrode on the semiconductor substrate on the first region.

Accordingly, at the time of forming the sidewall insulating film, since the emitter region formation insulating film below the emitter electrode is left, the sidewall insulating film can be formed on the emitter region as an active region of the first semiconductor element and the semiconductor substrate between the emitter region and the external base region without any damage.

Also, since the external base region can be formed by self-alignment with respect to the emitter electrode, and since a protective film is formed over the emitter electrode, it is possible to prevent changes in the characteristic caused by the introduction of impurities for forming the external base region to the emitter electrode.

Also, preferably, the step of forming said intrinsic base region comprises forming said intrinsic base region by ion implantation of an impurity to said semiconductor substrate in said first region and forming a diffusion layer of a conductive impurity at a lower concentration than that of a conductive impurity contained in said source/drain regions on said semiconductor substrate of said gate electrode side portion by ion implantation of an impurity to said second region.

As a result, it is possible to form a low concentration diffusion layer of the second semiconductor element simultaneously in the step of forming an intrinsic base region of the first semiconductor element, so the production steps can be reduced.

Preferably, the method comprises forming an impurity layer for increasing the impurity concentration of said collector region under said intrinsic base region in said first region after the process of forming said intrinsic base region and before forming said insulating film and forming a pocket region containing a conductive impurity different from the low concentration diffusion layer under said low concentration diffusion layer in said second region in the step of forming the impurity layer.

As a result, for example, in the step of forming an impurity layer for increasing the impurity concentration in the collector region below the base region of the first semiconductor element, a pocket region for preventing short channel effects of the second semiconductor element can be formed simultaneously, so the production steps can be reduced.

Preferably, the step of forming said external base region comprises ion implantation of an impurity to said semiconductor substrate in said first region and forming said external base region by self-alignment with respect to said emitter electrode while suppressing implantation of impurities to said emitter electrode by said protective film.

As a result, the source/drain regions of the second semiconductor element can be formed simultaneously in the step of forming the external base region of the first semiconductor element, so the production steps can be reduced.

For example, the step of forming said emitter electrode and the step of forming said protective film includes the steps of: forming an emitter-use conductive layer inside said opening of said insulating film and on said insulating film; forming said protective film on said emitter-use conductive layer; and, forming said emitter electrode and said protective film by forming a mask layer on said protective film-use film of a region where said emitter region is to be formed and removing said emitter-use conductive layer and said protective film-use film by using the mask layer as a mask.

BRIEF DESCRIPTION OF THE DRAWINGS

These and other objects and features of the present invention will become clearer from the following description of the preferred embodiments given with reference to the attached drawings, in which:

FIGS. 2A and 2B are sectional views of steps of a method of production of a semiconductor device of the present invention, wherein FIG. 2A is a view up to the step of forming an opening in an oxide film and FIG. 2B is a view up to the step of forming an n-type collector burying region and an n-type isolation region;

FIGS. 3C and 3D are sectional views of steps continuing from FIG. 2B, wherein FIG. 3C is a view up to the step of forming an n-type epitaxial layer and FIG. 3D is a view up to the step forming an element isolation insulating film;

FIGS. 4E and 4F are sectional views of steps continuing from FIG. 3D, wherein FIG. 4E is a view up to the step of forming an n-type collector plug region and FIG. 4F is a view up to the step of forming an n-type well;

FIGS. 5G and 5H are sectional views of steps continuing from FIG. 4F, wherein FIG. 5G is a view up to a step of forming the p-type well and FIG. 5H is a view up to the step of forming a gate insulating film;

FIGS. 6J and 6I are sectional views of steps continuing from FIG. 5H, wherein FIG. 6J is a view up to the step of forming a gate electrode and FIG. 6I is a view up to the step of forming a p-type LDD region;

FIGS. 7K and 7L are sectional views of steps continuing from FIG. 6I, wherein FIG. 7K is a view up to the step of forming an n-type LDD region and FIG. 7L is a view up to the step of forming an intrinsic base region and an SIC region;

FIGS. 8M and 8N are sectional views of steps continuing from FIG. 7L, wherein FIG. 8M is a view up to the step of forming a sidewall insulating film and FIG. 8N is a view up to the step of forming openings for forming an emitter;

FIGS. 9O and 9P are sectional views of steps continuing from FIG. 8N, wherein FIG. 9O is a view up to the step of forming an antireflection film and FIG. 9P is a view up to the step of forming an emitter polycrystalline silicon layer;

FIGS. 10Q and 10R are sectional views of steps continuing from FIG. 9P, wherein FIG. 10Q is a view up to the step of forming a sidewall insulating film and FIG. 10R is a view up to the step of forming source/drain regions of an nMOS transistor and n-type collector take-out region;

FIGS. 11S and 11T are sectional views of steps continuing from FIG. 10R, wherein FIG. 11S is a view up to the step of forming source/drain regions of a pMos transistor and FIG. 11T is a view up to the step of forming openings for interconnections;

FIGS. 12J–L and 12K are other examples of a method of production of a semiconductor device according to the present embodiment;

FIGS. 14A and 14B are sectional views of steps of a method of production of a BicMos transistor of the related art, wherein FIG. 14A is a view up to the step of forming an opening in an oxide film and FIG. 14B is a view up to the step of forming an n-type collector burying region and n-type separation region;

FIGS. 15C and 15D are sectional views of steps continuing from FIG. 14B, wherein FIG. 15C is a view up to the step of forming an n-type epitaxial layer and FIG. 15D is a view up to the step of forming an element isolation insulating film;

FIGS. 16E and 16F are sectional views of steps continuing from FIG. 15D, wherein FIG. 16E is a view up to the step of forming an n-type collector plug region and FIG. 15F is a view up to the step of forming an n-type well;

FIGS. 17G and 17H are sectional views of steps continuing from FIG. 16F, wherein FIG. 17G is a view up to a step of forming p-type well and FIG. 17H is a view up to a step-of forming a gate insulating film;

FIGS. 18I and 18J are sectional views of steps continuing from FIG. 17H, wherein FIG. 18I is a view up to the step of forming a gate electrode and FIG. 18J is a view up to the step of forming a p-type LDD region;

FIGS. 19K and 19L are sectional views of steps continuing from FIG. 18J, wherein FIG. 19K is a view up to the step of forming an n-type LDD region and FIG. 19L is a process of forming an intrinsic base region and SIC region;

FIGS. 20M and 20N are sectional views of steps continuing from FIG. 19L, wherein FIG. 20M is a view up to the step of forming a sidewall-use insulating film and FIG. 20N is a view up to the step of forming a sidewall insulating film;

FIGS. 21O and 21P are sectional views of steps continuing from FIG. 20N, wherein FIG. 21O is a view up to the step of forming a source/drain region of an nMOS transistor and n-type collector take-out region and FIG. 21P is a view up to the step of forming a source/drain region of a pMOS transistor and an external base region;

FIGS. 22Q and 22R are sectional views of steps continuing from FIG. 21P, wherein FIG. 22Q is a view up to the step of forming an oxide film for forming an emitter and FIG. 22R is a view up to the step of forming an emitter polycrystalline silicon layer; and FIGS. 23S and 23T are sectional views of steps continuing from FIG. 22R, wherein FIG. 23S is a view up to the step of forming emitter polycrystalline silicon and FIG. 23T is a view up to the step of forming an opening for interconnection to an interlayer insulating film.

DESCRIPTION OF THE PREFERRED EMBODIMENTS

Below, an embodiment of a method of production of a semiconductor device of the present invention will be explained with reference to the drawings.

Figure 1:
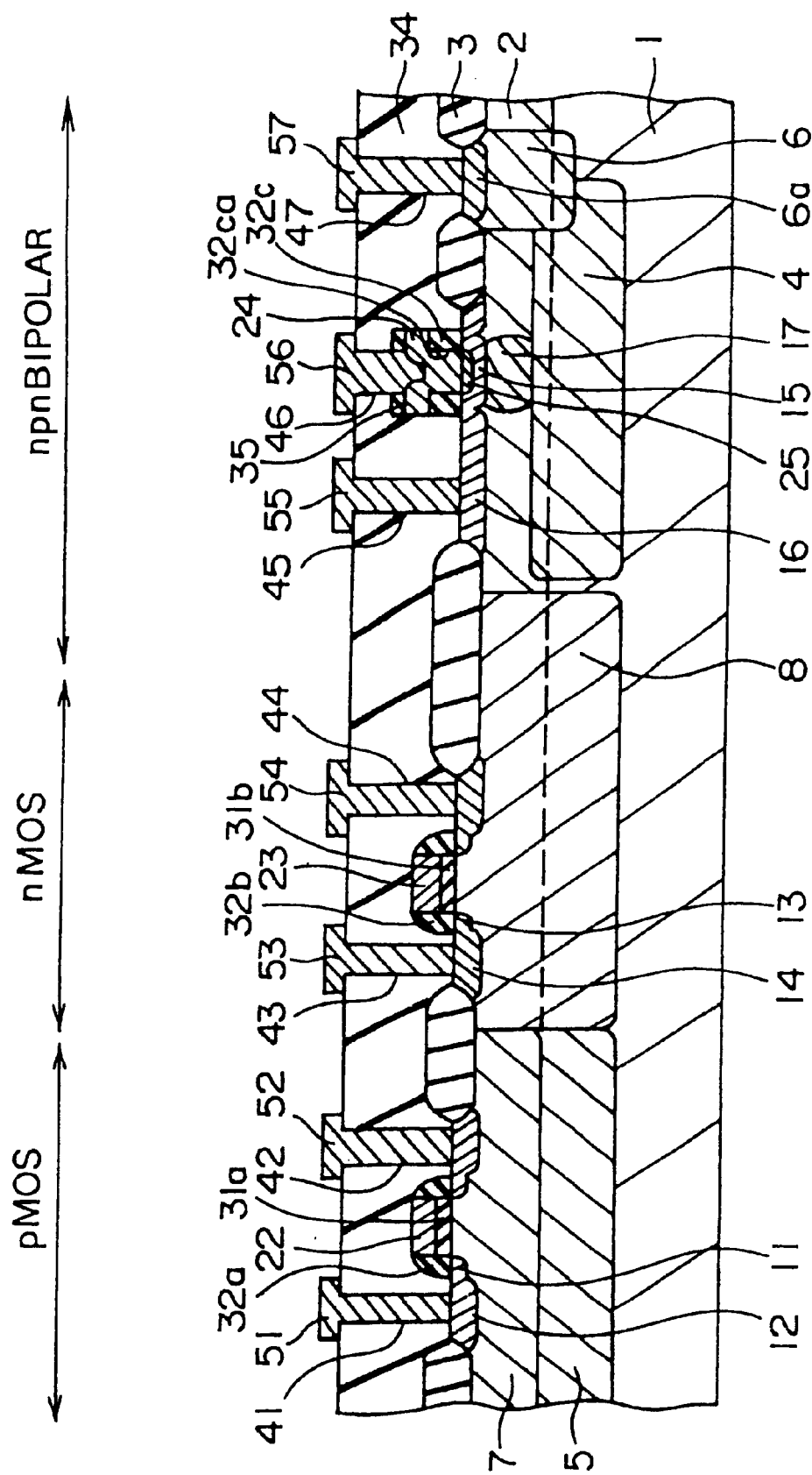
FIG. 1 is a sectional view of a BiCMOS transistor produced by a method of production of a semiconductor device of the present invention.

FIG. 1 is a sectional view of a BiCMOS transistor produced by a method of production of a semiconductor device of the present invention.

As shown in FIG. 1, an n-type epitaxial layer 2 is formed on a p-type semiconductor substrate 1; and, an element isolation insulating film 3 is formed by LOCOS on a surface of the n-type epitaxial layer 2.

In an npn bipolar transistor region, an n-type collector burying region 4 is formed below the n-type epitaxial layer 2 for forming an n-type collector region: and a selective-ion-implantation-of-collector (SIC) region 17 for increasing the concentration of the collector impurity immediately below a base is formed above the n-type collector burying region 4.

An intrinsic base region 15 containing a p-type impurity and an external base region 16 containing a p-type impurity of a higher concentration than that in the intrinsic base region 15 and reduced in resistance are formed connected for taking out the base on the surface of the n-type epitaxial layer 2.

A silicon oxide film 32c is formed on part of the p-type base region 15. Emitter polycrystalline silicon 24 is formed in an opening 32ca formed on the silicon oxide film 32c and on the silicon oxide film 32c. An anti-reflection film 35 is formed on the emitter Polycrystalline silicon 24; and, an n-type emitter region 25 is formed on the surface of the intrinsic base region 15 below the emitter polycrystalline silicon 24.

Also, an n-type collector plug region 6 and an n-type collector take-out region 6a are formed on a part of the n-type epitaxial layer 2 on the n-type collector burying region 4 over the p-type base region (15 and 16).

An n-type separation region 5 for separating from the p-type semiconductor substrate 1 is formed on the pMOS transistor formation region, while an N-type well 7 is formed on the n-type epitaxial layer 2. A p-type well 8 is formed on the nMOS transistor formation region.

In the pMOS and nMOS transistor formation regions, source/drain regions (12 and 14) having LDD regions (11 and 13) are formed on the surface of the n-type well 7 and p-type well 8.

Also, gate electrodes (22 and 23) are formed between the source/drain regions (12 and 14) via gate oxide films (31a and 31b). Sidewall insulating films (32a and 32b) are formed on the side portions of the gate electrodes (22 and 23).

An interlayer insulating film 34 is formed covering the entire surface of the transistors. Contact holes (41, 42, 43, 44, 45, 46 and 47) reaching the source/drain regions (12, 14) of the pMOS and nMOS transistors, the external base region 16 and the emitter electrode 24 of the npn bipolar transistor, and a collector take-out region 6a are formed on the interlayer insulating film 34. Interconnection layers (51, 52, 53, 54, 55, 56 and 57) are formed inside and over the contact holes.

The method of production of a semiconductor device having the above configuration will be explained next.

Figures 2A, 2B:
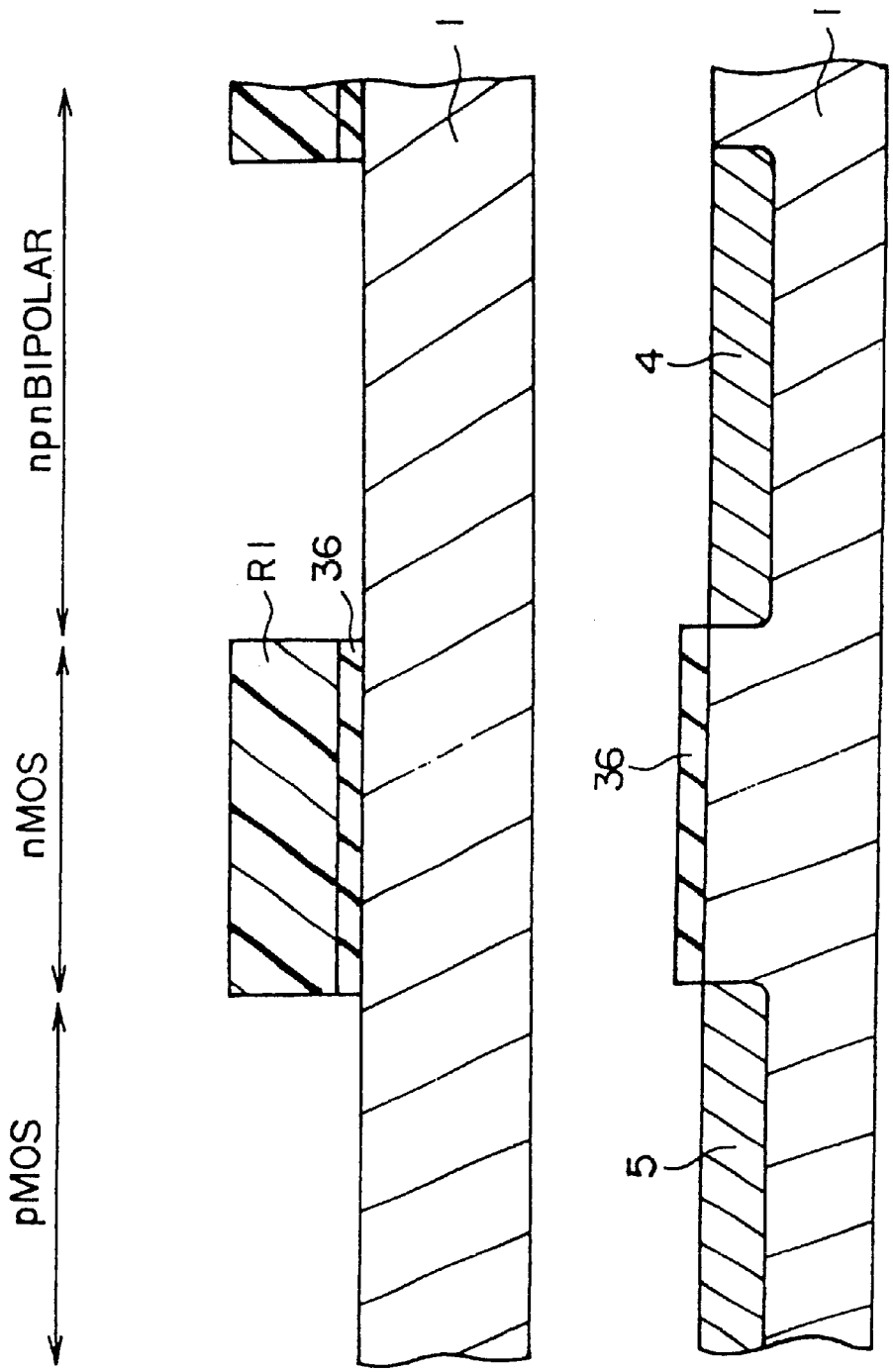

First, as shown in FIG. 2A, for example, a p-type silicon semiconductor substrate 1 is oxidized by thermal oxidation to form an oxide film 36, for example, to a thickness of 300 nm on the surface. A resist film R1 of a pattern having openings at the npn bipolar transistor formation region and pMOS transistor formation region on the above silicon semiconductor substrate 1 is formed by coating a resist and lithography.

Then, by using the resist film R1 as a mask, openings are formed in the oxide film 36 formed on the surface of the silicon semiconductor substrate 1 at the npn bipolar transistor formation region and pMOS transistor formation region, for example, by wet etching using hydrofluoric acid.

Next, as shown in FIG. 2B, the resist film R1 is removed, for example, by using a mixed solution of hydrogen peroxide and sulfuric acid; and, then antimony is diffused in the silicon semiconductor substrate 1 through the openings formed on the above oxide film 36 by thermal diffusion at 1200° C. for 60 minutes using a solid source of antimony oxide ($Sb_2O_3$) so as to form, for example, an n-type collector burying region 4 and an n-type isolation region 5 for isolation from the p-type semiconductor substrate 1.

Next, as shown in FIG. 3C, the oxide film 36 is removed by, for example, wet etching using hydrofluoric acid; and, then an n-type epitaxial layer 2, for example, having a thickness of 1 μm and a resistance of 1 Ωcm is formed on the silicon semiconductor substrate 1 by epitaxial growth.

Next, as shown in FIG. 3D, an element isolation insulating film 3 is formed on the n-type epitaxial layer 2 by LOCOS.

In the step of forming the element isolation insulating film 3, for example, a silicon oxide film 3a having a thickness of, for example, 30 nm is formed by oxidizing the surface of the n-type epitaxial layer 2 by thermal oxidation.

Further, a not shown silicon nitride film is formed to a thickness of, for example, 100 nm on the above silicon oxide film 3a by low pressure chemical vapor deposition (LPCVD).

Then, a not shown resist film of a pattern having an opening at the element isolation insulating film formation region is formed on the silicon nitride film. Using the resist film as a mask, the silicon nitride film on the element isolation insulating film formation region is removed by reactive ion etching (RIE).

Next, the silicon nitride film formed at regions other than the element isolation insulating film formation region is used as an oxidation resistant mask. The surface of the n-type epitaxial layer 2 is thermally oxidized in a wet oxidizing atmosphere at 1050° C., so an element isolation information film 3 having a thickness of, for example, 450 nm is formed. Then, an element isolation insulating film 3 is formed by removing the silicon nitride film selectively by etching with, for example, hot phosphoric acid at 150 ° C.

Figure 4E:
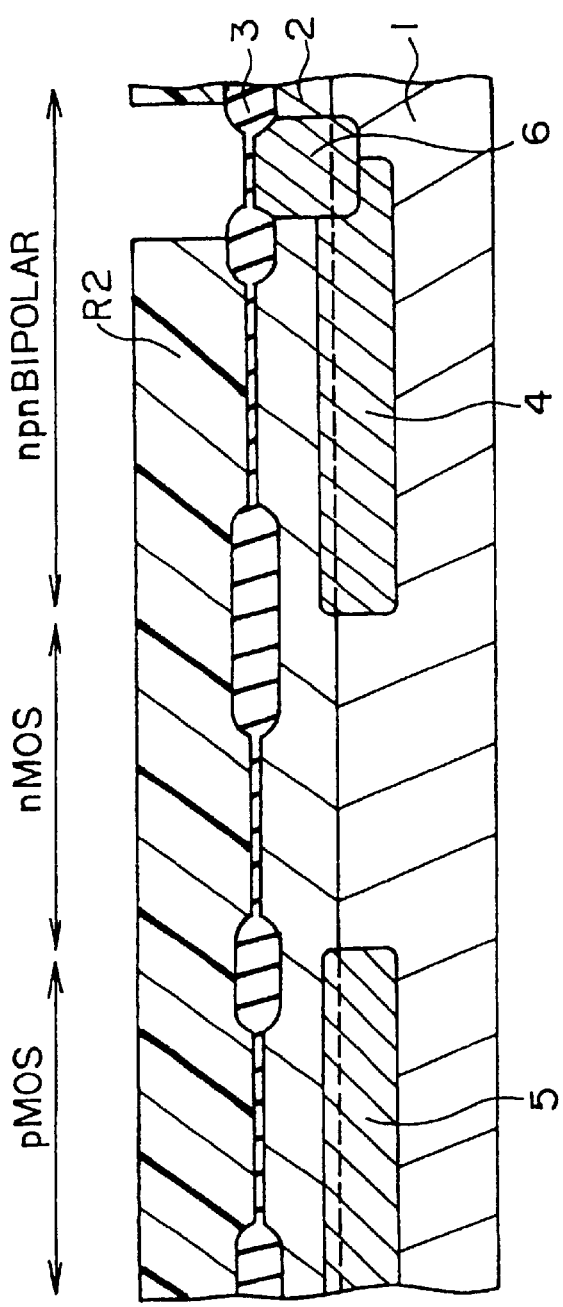

Next, as shown in FIG. 4E, an n-type collector plug region 6 connected to the n-type collector burying region 4 on the npn bipolar transistor formation region is formed on the n-type epitaxial layer 2.

The n-type collector plug region 6 is formed by forming a resist film R2 having an opening at the region for forming the n-type collector plug region 6, and then using the resist film R2 as a mask for ion implantation of phosphorus as an n-type impurity under the conditions of an ion energy of 500 keV and a dosage of $2\times10^{12}$ atoms/$cm^2$ and an ion energy of 70 keV and a dosage of $7\times10^{15}$ atoms/$cm^2$. After that, the resist film R2 is removed by a resist peeling technique.

Figure 4F:
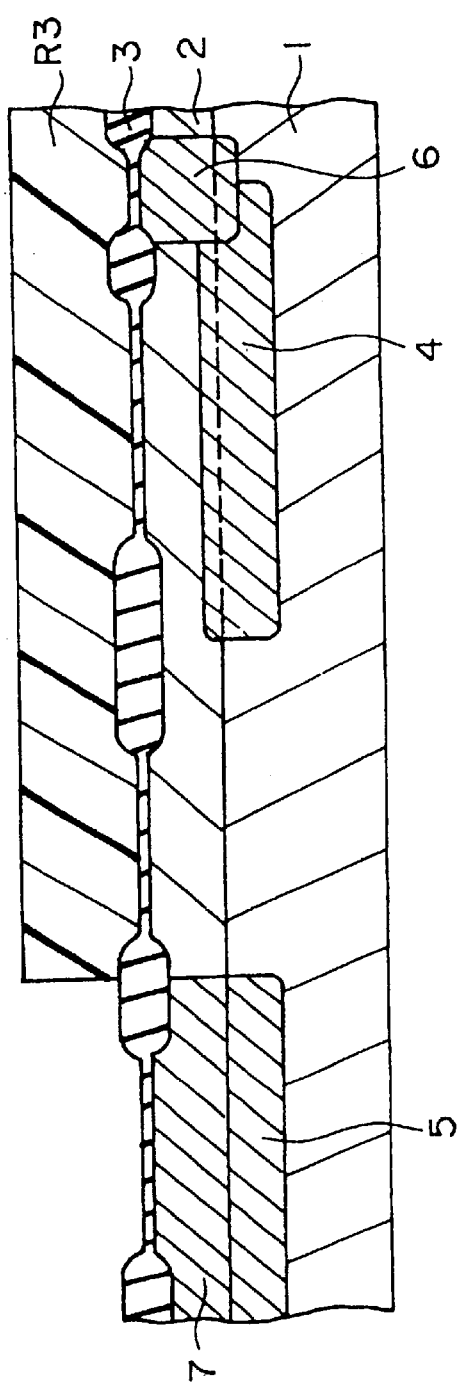

Next, as shown in FIG. 4F, a resist film R3 having an opening at the pmos transistor formation region is formed by lithography on the n-type epitaxial layer 2. This is used as a mask for ion implantation of an n-type impurity, for example, phosphorus ($P^+$), under the conditions of an ion energy of 600 keV and a dosage of $5\times10^{12}$ atoms/cm$^2$, and conditions of an ion energy of 300 keV and a dosage of $3\times10^{12}$ atoms/cm$^2$, so as to form an n-type well 7. Further, ion implantation of a p-type impurity, for example, boron ($B^+$) is performed for controlling the threshold under conditions of an ion energy of 20 keV and a dosage of $5\times10^{12}$ atoms/cm$^2$. Next, the resist film R3 is removed.

Next, as shown in FIG. 5G, a resist film R4 having openings at the nMOS transistor formation region and at the part of the element isolation region between the pMOS and nMOS transistors and the npn bipolar transistor formation region on the n-type epitaxial layer 2 is formed. This is used as a mask for ion implantation of a p-type impurity, for example, boron, under the conditions of an ion energy of 800 keV and a dosage of $5\times10^{12}$ atoms/cm$^2$, conditions of an ion energy of 350 keV and a dosage of $5\times10^{12}$ atoms/cm$^2$, and conditions of an ion energy of 100 keV and a dosage of $5\times10^{12}$ atoms/cm$^2$ to form a p-type well 8 using the element isolation region in common.

Further, ion implantation of an n-type impurity, for example, phosphorus is performed for controlling a threshold under the conditions of an ion energy of 20 kev and a dosage of $2\times10^{12}$ atoms/cm$^2$.

Next, as shown in FIG. 5H, the resist film R4 is removed, the oxide film 3a is removed by wet etching by using hydrofluoric acid (HF) and a gate insulating film 31 having a thickness of, for example, 5 nm, is formed by thermal oxidation in a wet oxidizing atmosphere at 850° C. for 5 minutes.

Figure 6I:
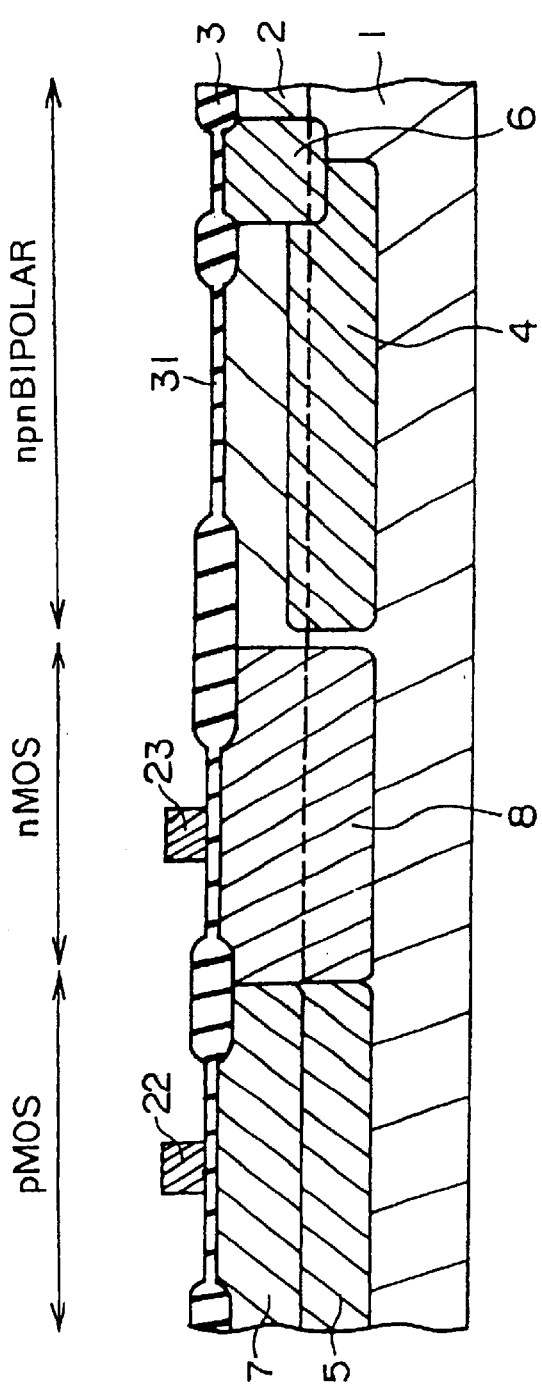

Next, as shown in FIG. 6I, gate electrodes (22 and 23) are formed on the nMOS and pMOS transistor formation regions.

In the step of forming the gate electrodes (22 and 23), a not shown polycrystalline silicon film is formed to a thickness of, by, for example, 100 nm, for example, LPCVD. Phosphorus is introduced to the polycrystalline silicon film at a high concentration by predeposition using, for example, phosphoryl trichloride ($POCL_3$).

Then, a not shown tungsten film is formed to a thickness of, for example, 100 nm by, for example, chemical vapor deposition (CVD), a not shown resist film having a gate electrode pattern of the pMOS and nMOS transistors is formed by lithography, and the tungsten film and polycrystalline silicon film other than the gate electrode portions are removed by RIE. As a result, gate electrodes (22 and 23) made by the polycrystalline silicon film and tungsten film are formed.

Figure 6J:
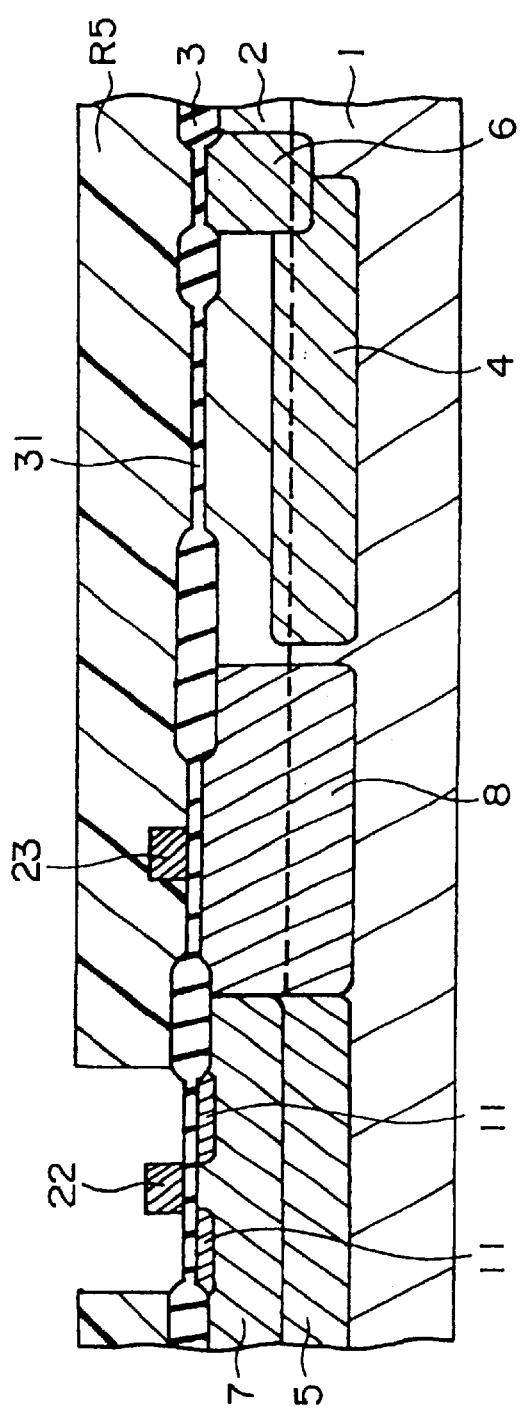

Next, as shown in FIG. 6J, a resist film R5 having an opening at the pMOS transistor formation region is formed by lithography. The resist film R5 is used as a mask for ion implantation of a p-type impurity, for example, boron difluoride ($BF^{2+}$), under the conditions of an ion energy of 23 keV and a dosage of $2\times10^{13}$ atoms/cm$^2$ to form a p-type LDD region 11 in the n-type well 7 in the epitaxial layer 2 on the two sides of the gate electrodes 22.

Also, by successive ion implantation of an n-type impurity, for example, arsenic ($As^+$), below the p-type LDD region 11 under the conditions of an ion energy of 300 keV and a dosage of $1.5\times10^{13}$ atoms/cm$^2$ for preventing short channel effects, a not shown n-type pocket for forming part of the n-type well 7 is formed below the p-type LDD region 11.

Then, the resist film R5 is removed.

Figures 7K, 7L:
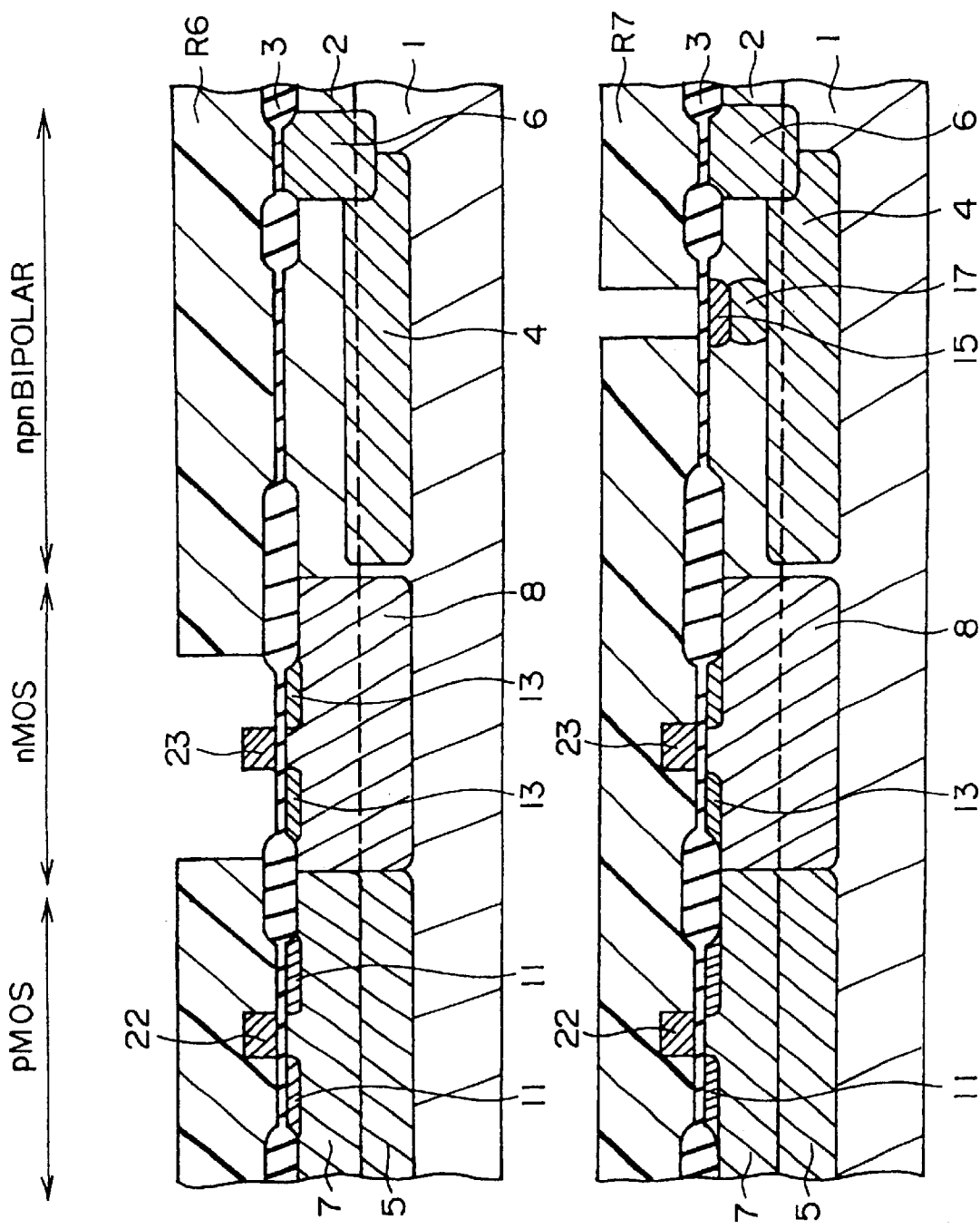

Next, as shown in FIG. 7K, a resist film R6 having an opening at the nMOS transistor formation region is formed by lithography. The resist film R6 is used as a mask for ion implantation of an n-type impurity, for example, arsenic ($As^+$), under the conditions of an ion energy of 60 keV and a dosage of $3.5\times10^{13}$ atoms/cm$^2$ to form an n-type LDD region 13 in the p-type well 8 in the epitaxial layer 2 on the two sides of the gate electrode 23.

Also, by successive ion implantation of a p-type impurity, for example, boron ($B^+$), below the n-type LDD region 13 under the conditions of an ion energy of 30 keV and a dosage of $1.2\times10^{13}$ atoms/cm$^2$ for preventing short channel effects, a not shown p-type pocket for forming part of the p-type well 8 is formed under the n-type LDD region 13.

Then, the resist film R6 is removed.

Next, as shown in FIG. 7L, a resist film R7 having an opening at the intrinsic base formation region of the npn bipolar transistor is formed by lithography. The resist film R7 is used as a mask for ion implantation of a p-type impurity, for example, boron difluoride, under the conditions of an ion energy of 30 kev and a dosage of $5\times10^{13}$ atoms/cm$^2$ to form the intrinsic base region 15. Note that the intrinsic base region 15 also serves as a link base region between an external base region formed later on and the intrinsic base region.

Further, by successive ion implantation of an n-type impurity, for example, phosphorus, using the resist film R7 as a mask under the conditions of an ion energy of 120 keV and a dosage of $3\times10^{12}$ atoms/cm$^2$ and the conditions of an ion energy of 360 keV and a dosage of $3\times10^{12}$ atoms/cm$^2$, an SIC region 17 for increasing the concentration of the collector impurity immediately below the intrinsic base region 15 is formed.

Note that in the above step, the intrinsic base region 15 of the npn bipolar transistor may be about the same size as that of an emitter polysilicon to be formed later on.

Figure 8M:
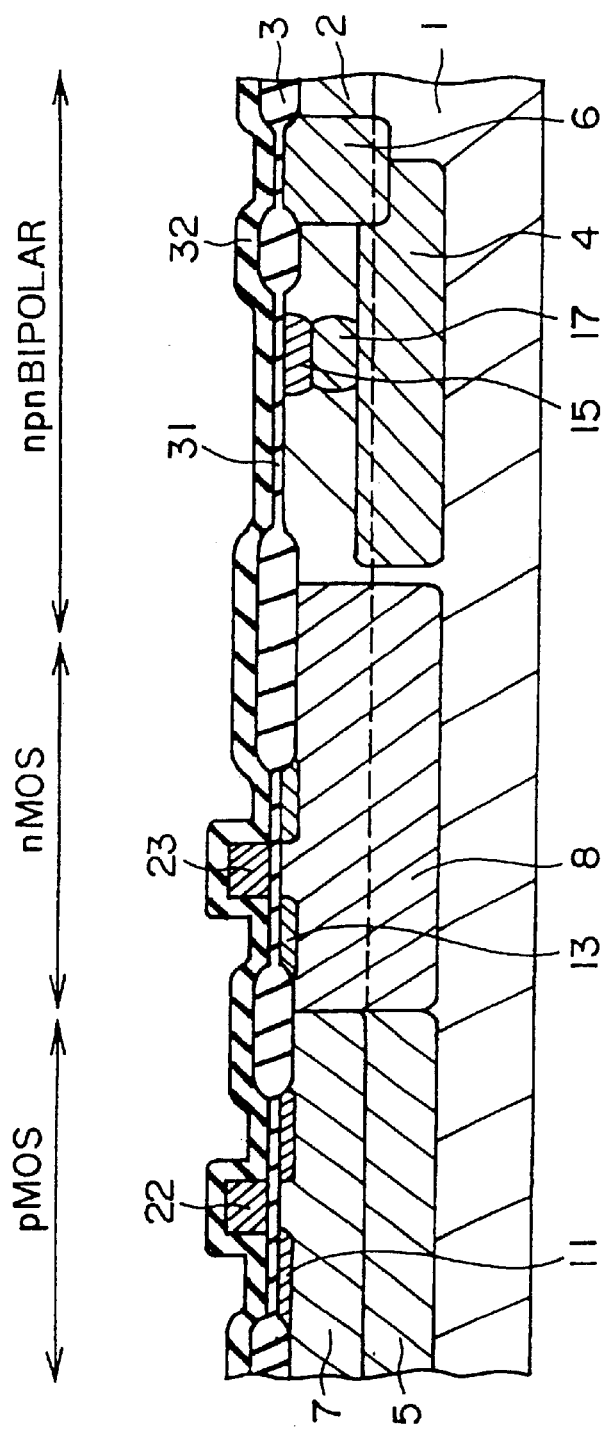

Next, as shown in FIG. 8M, a sidewall-use insulating film 32 is formed by depositing silicon oxide on the entire surface covering the transistors to a thickness of, for example, 200 nm by CVD.

Figure 8N:
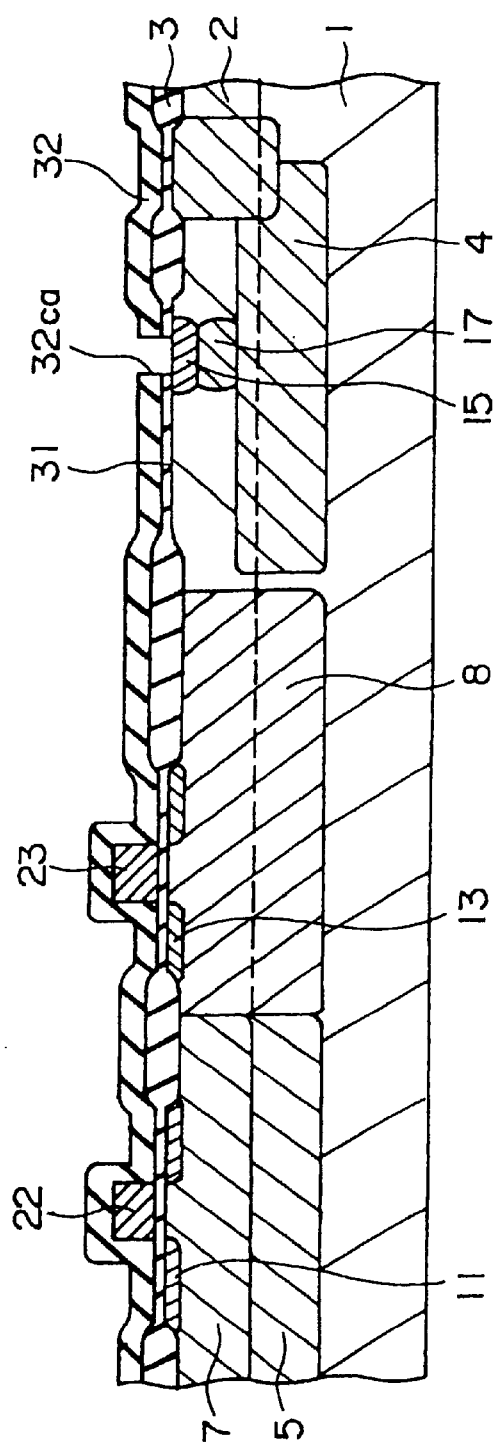

Next, as shown in FIG. 8N, a not shown resist film having an opening at the emitter formation region is formed on the sidewall-use insulating film 32 by lithography. Using the resist film as a mask, emitter forming-use openings 32ca are formed on the sidewall-use insulating film 32 and gate insulating film 31.

Next, as shown in FIG. 9O, polycrystalline silicon doped with the n-type impurity arsenic to a high concentration is deposited, for example, to a thickness of 150 nm, on the entire surface of the sidewall-use insulating film 32, including the opening 33ca, by LPCVD to form an emitter polycrystalline silicon-use layer 24a.

Further, a silicon oxide film is deposited by, for example, CVD to a thickness of 10 nm on the entire surface to cover the emitter polycrystalline silicon-use layer 24a. A silicon nitride film is further deposited by CVD to a thickness of 110 nm to form the anti-reflection film 35a.

Next, as shown in FIG. 9P, a resist film R8 having the pattern of the emitter polycrystalline silicon of the npn bipolar transistor is formed by lithography on the emitter polycrystalline silicon-use layer 24a. The resist film R8 is used as a mask for patterning the anti-reflection film 35a and the emitter polycrystalline silicon-use layer 24a by, for example, RIE, to form the anti-reflection film 35 and the emitter polycrystalline silicon 24.

Figure 10Q:
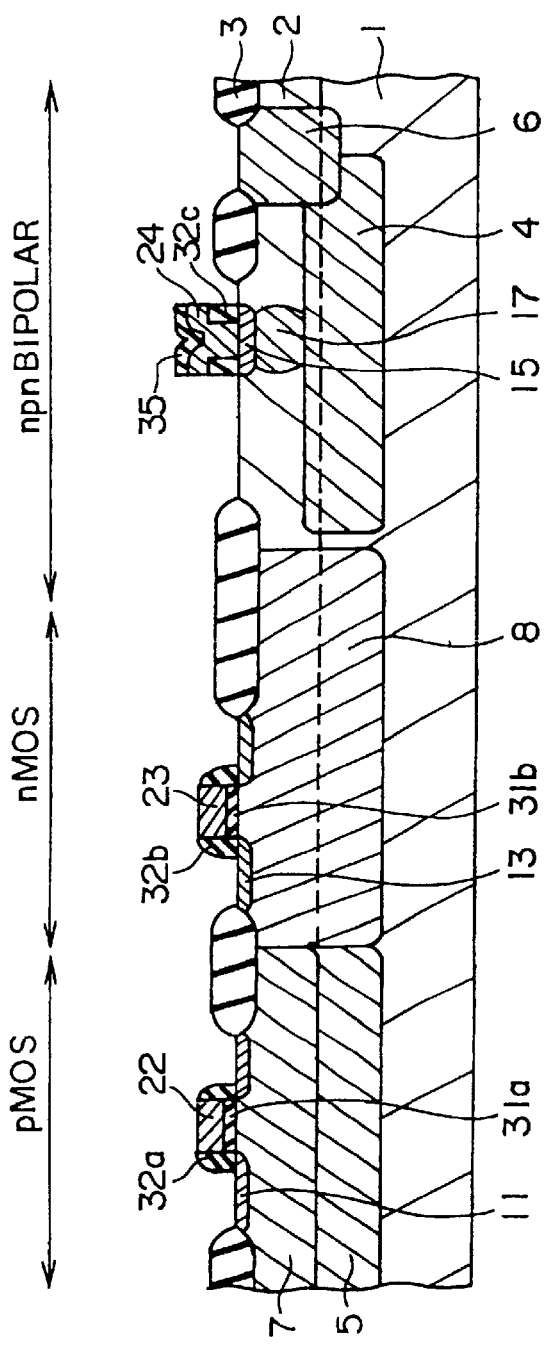

Next, as shown in FIG. 10Q, using the resist film R8 as a mask, the sidewall-use insulating film 32 and the gate insulating film 31 are removed by etching, for example, by RIE, to form the sidewall insulating films (32a and 32b) on the side portions of the gate electrodes (22 and 23). Note that at this time, the silicon oxide film 32c left as a sidewall-use insulating film also remains below a part of the emitter polycrystalline silicon 24. Also, the gate insulating films (31a and 31b) are formed below the gate electrodes (22 and 23). Then, the resist film R8 is removed.

Note that in the figure, the gate insulating film below the sidewall insulating film (32a and 32b) and the silicon oxide film 32c are illustrated together with the sidewall insulating film and the oxide silicon film.

Next, as a buffer for ion implantation to be performed in a later step, a not shown silicon oxide film is deposited to an extent of, for example, 10 nm by, for example, CVD. The silicon oxide film is grown to about 12 nm by thermal oxidation.

Figure 10R:
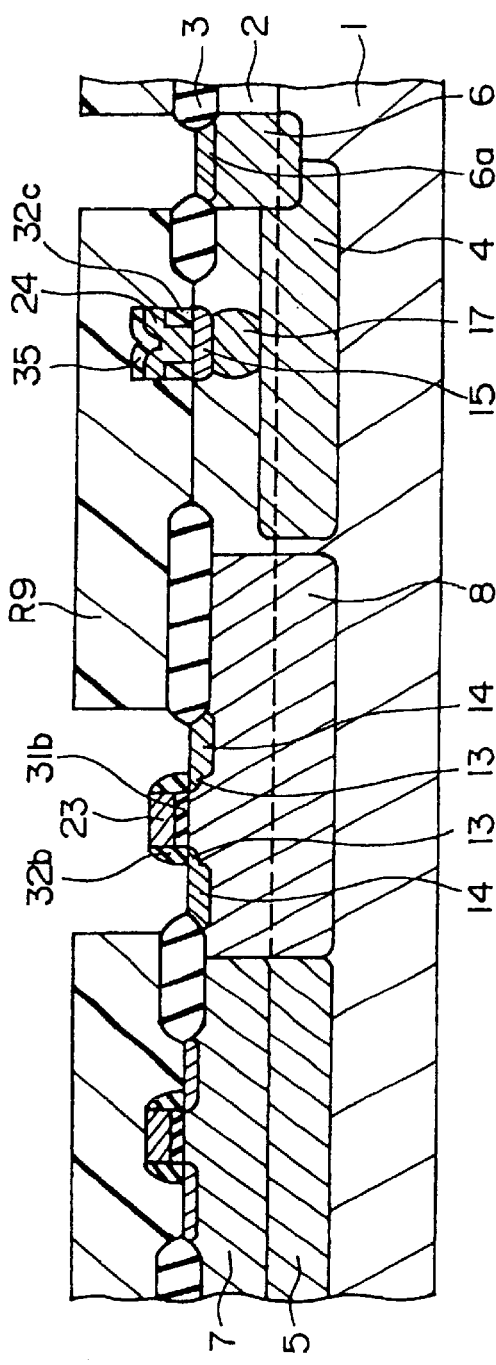

Next, as shown in FIG. 10R, a resist film R9 having openings at the nMOS transistor formation region and the n-type collector plug region 6 of the npn bipolar transistor is formed by lithography. This is used for a mask for ion implantation of an n-type impurity, for example, arsenic, under the conditions of an ion energy of 35 kev and a dosage of $5\times10^{15}$ atoms/cm$^2$ to form a source/drain region 14 of the nMOS transistor and an n-type collector take-out region 6a of the npn bipolar transistor.

Figures 11S, 11T:
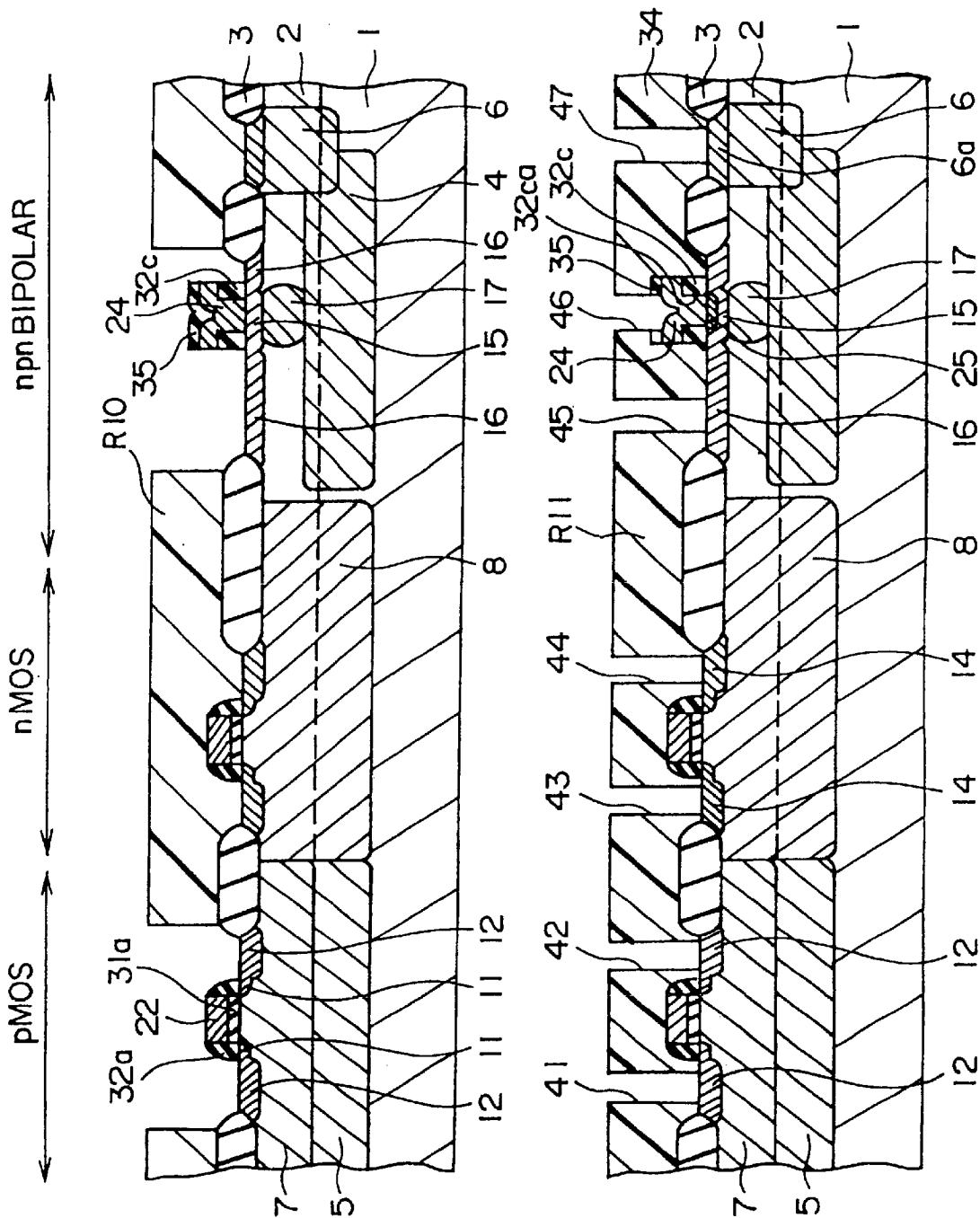
Figure 13:
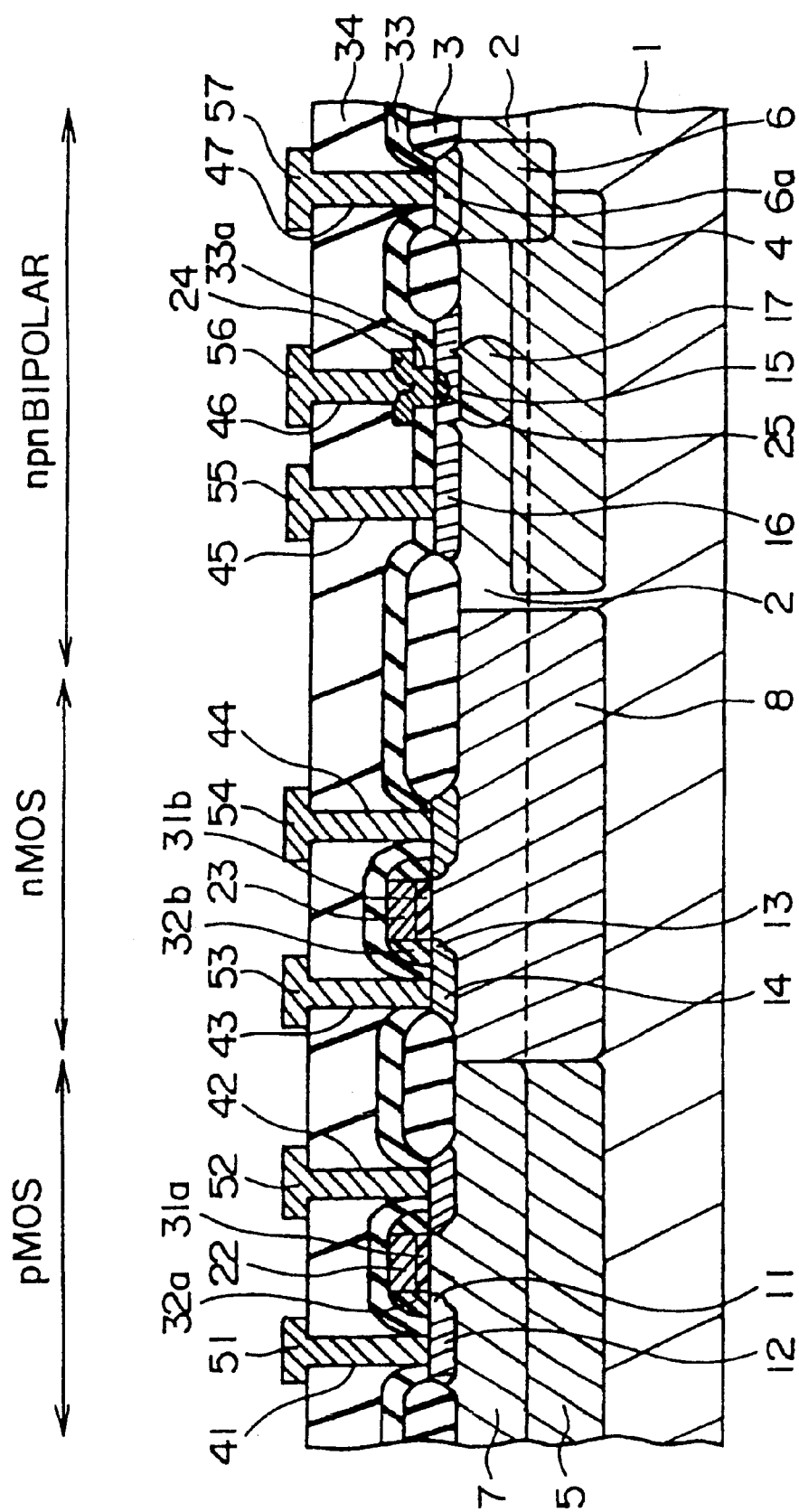
FIG. 13 is a sectional view of a BiCMOS transistor produced by a method of production of the related art.
Figures 15C, 15D:
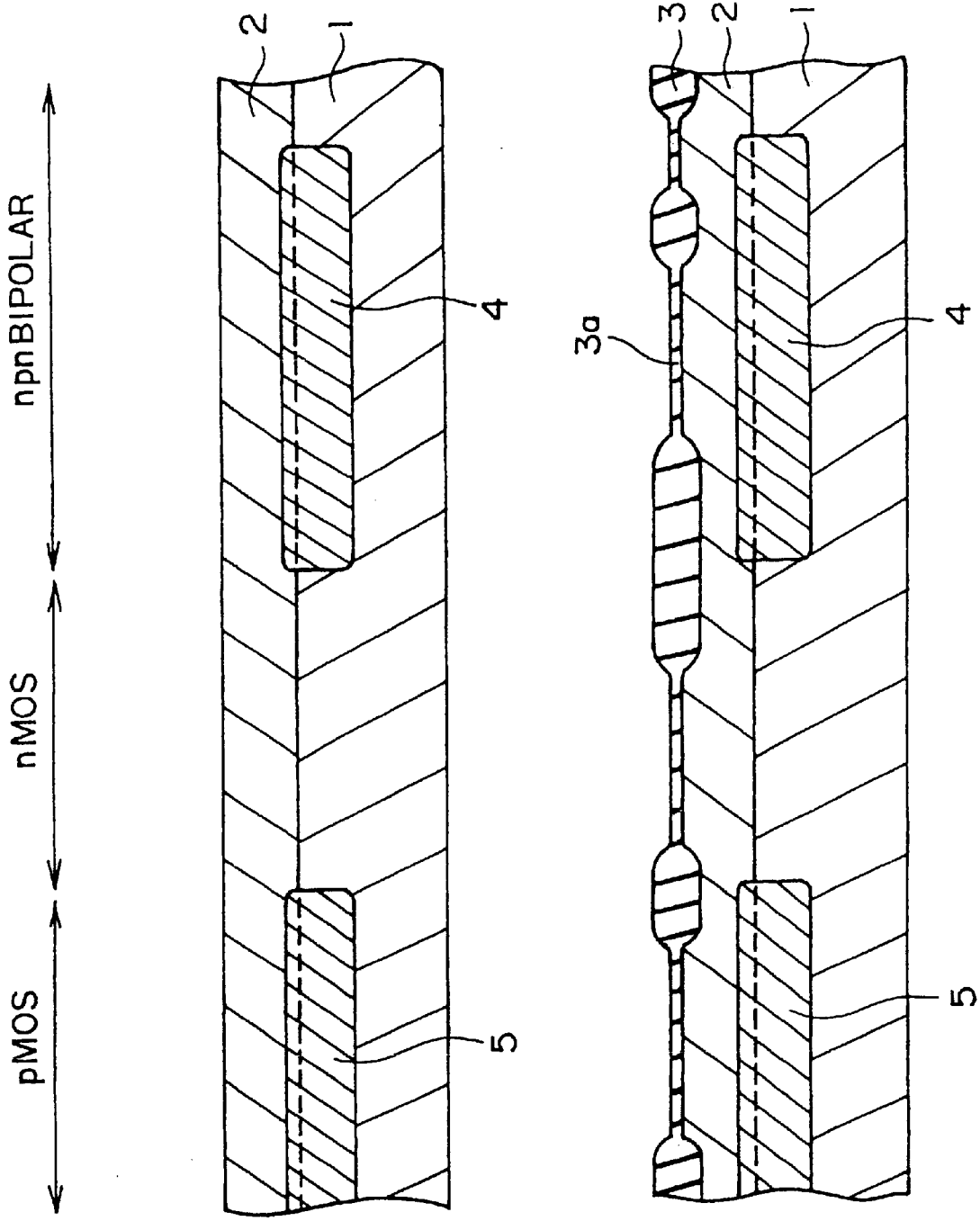
Figures 16E, 16F:
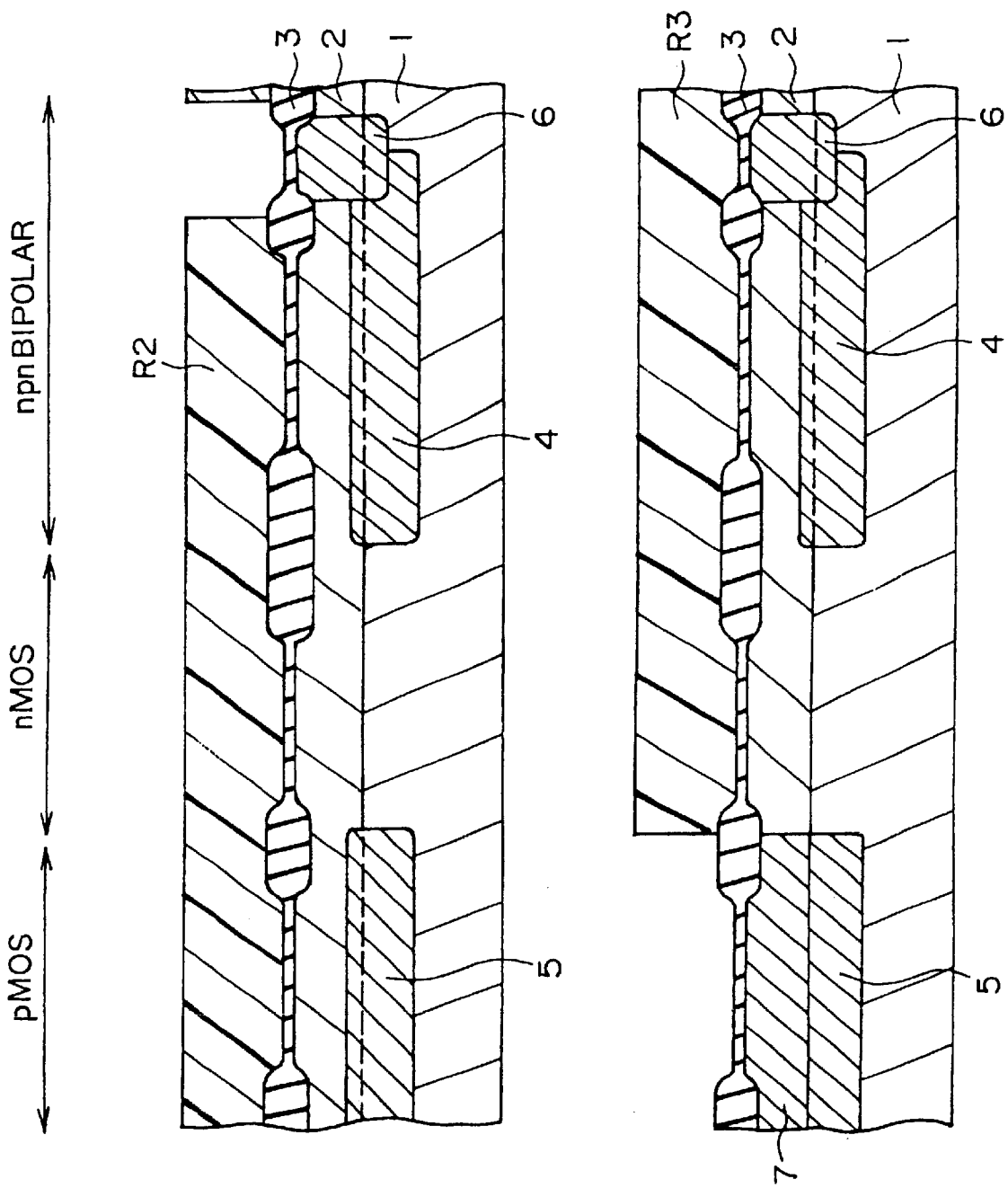
Figure 18I:
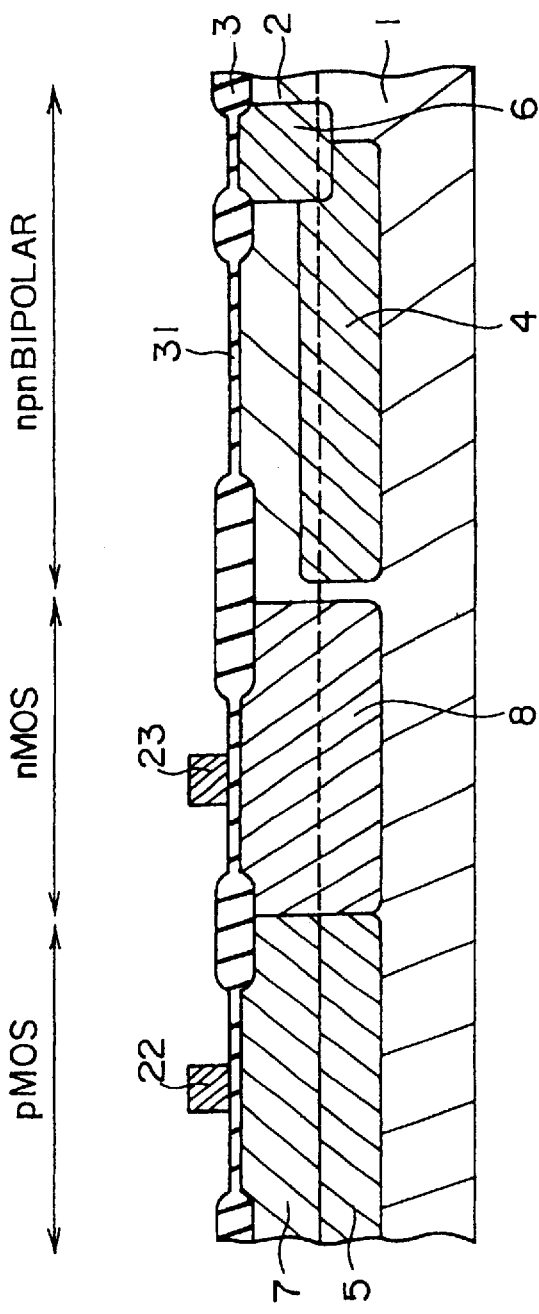
Figure 18J:
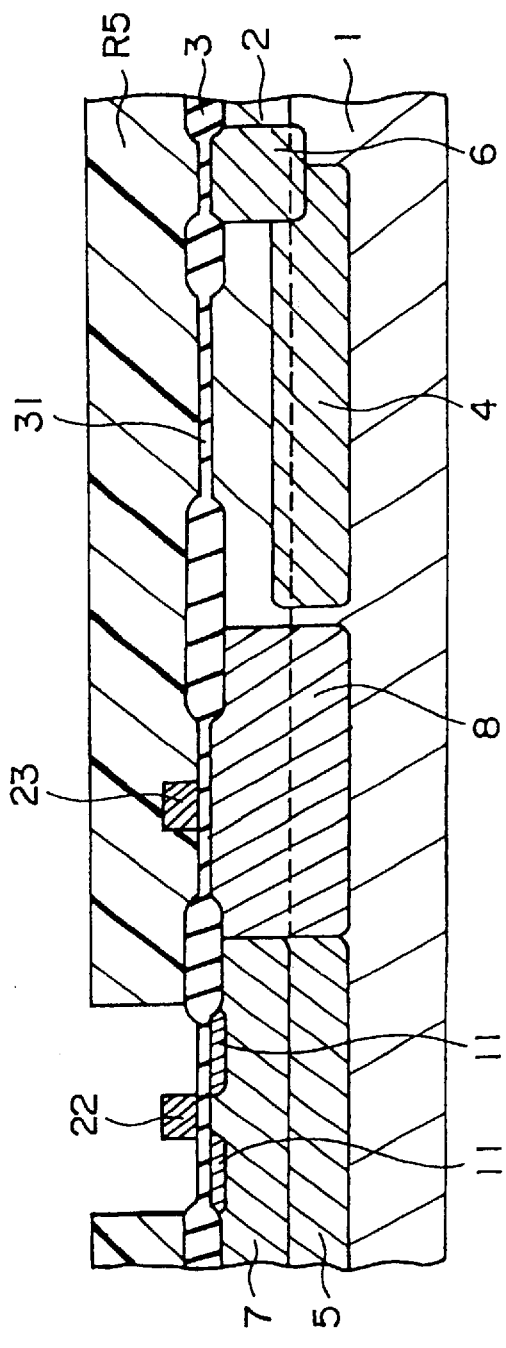
Figure 19K:
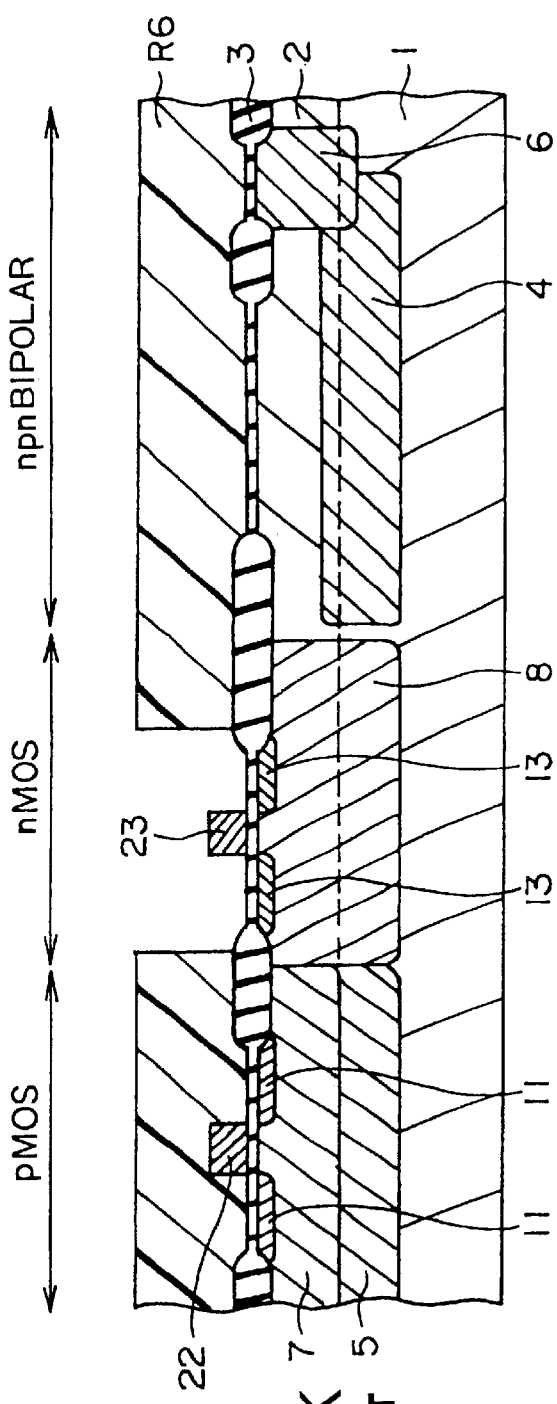
Figure 19L:
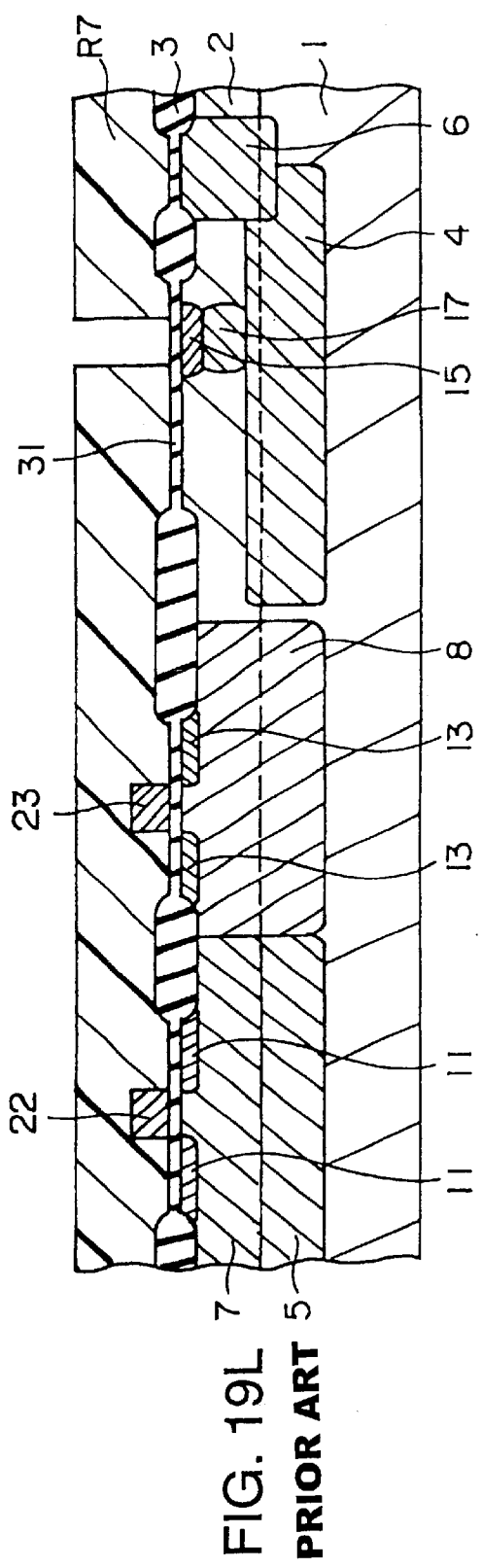
Figure 21O:
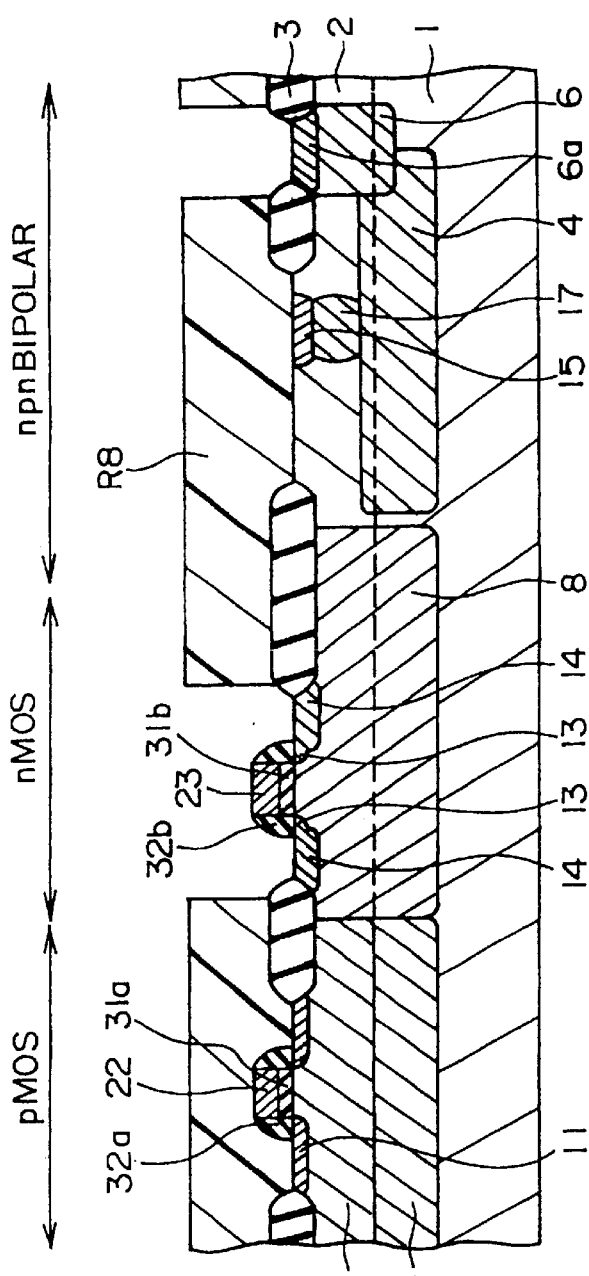
Figure 21P:
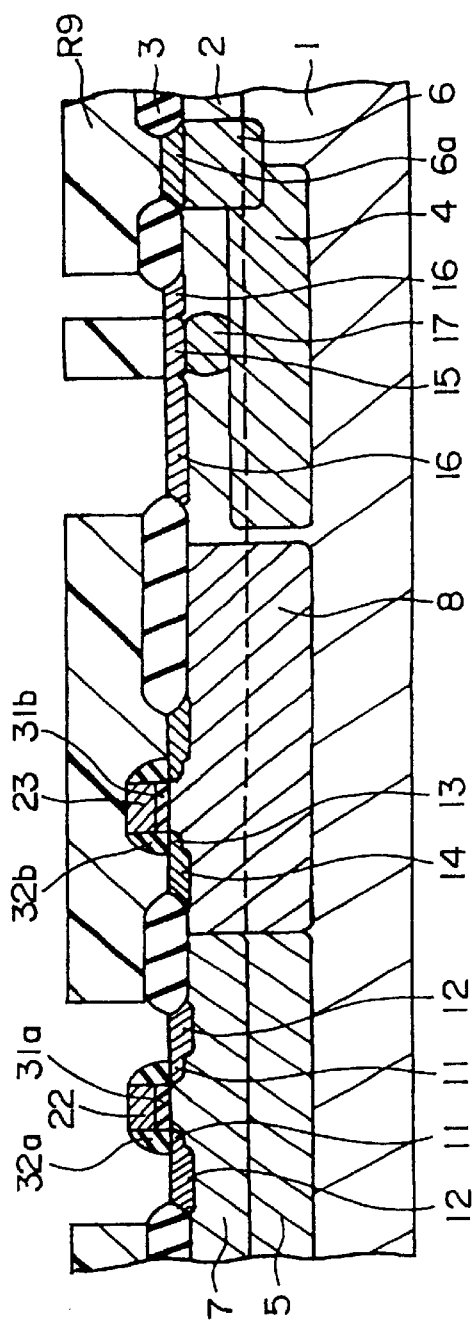
Figure 22Q:
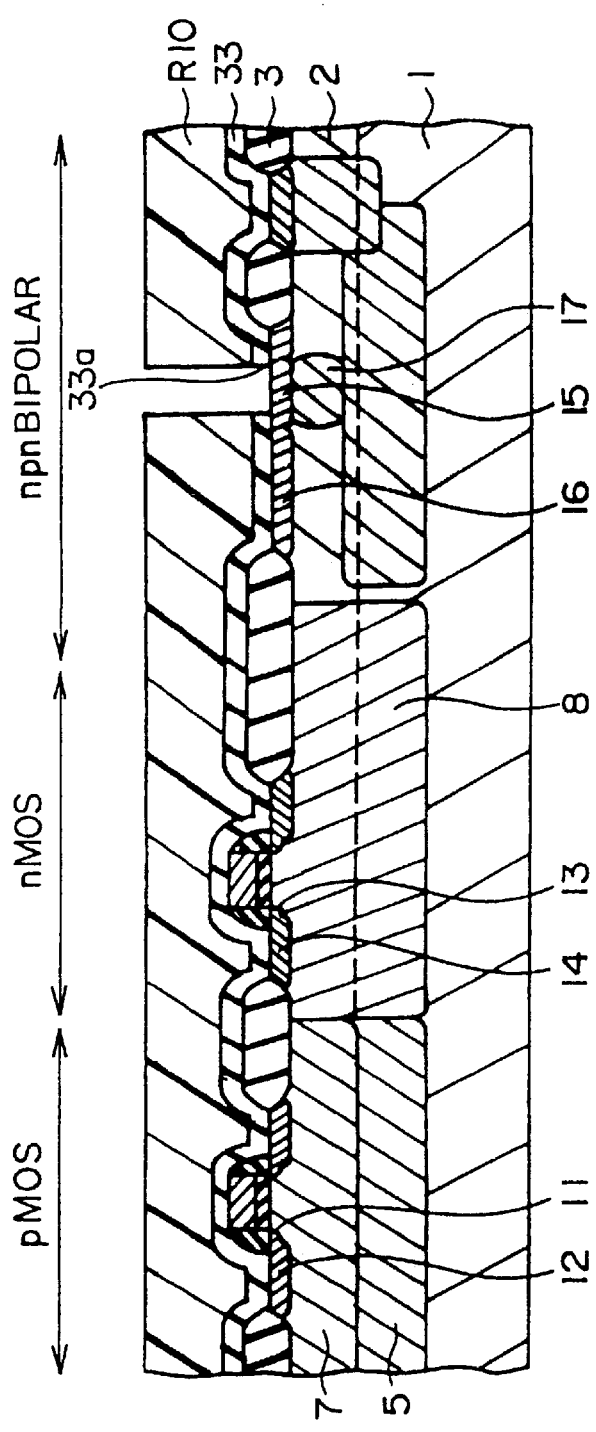
Figure 22R:
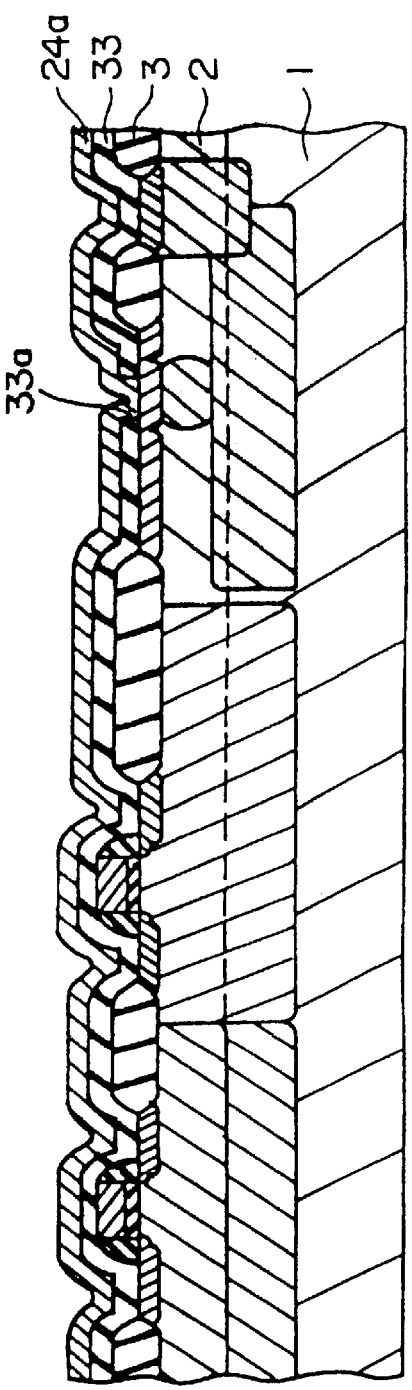
Figure 23S:
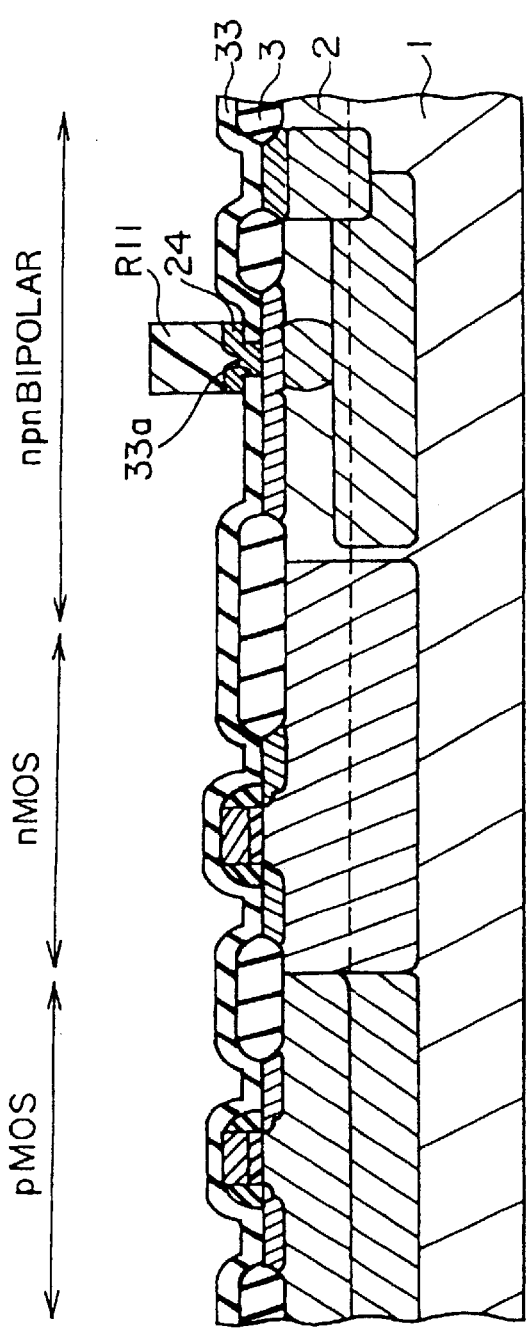
Figure 23T:
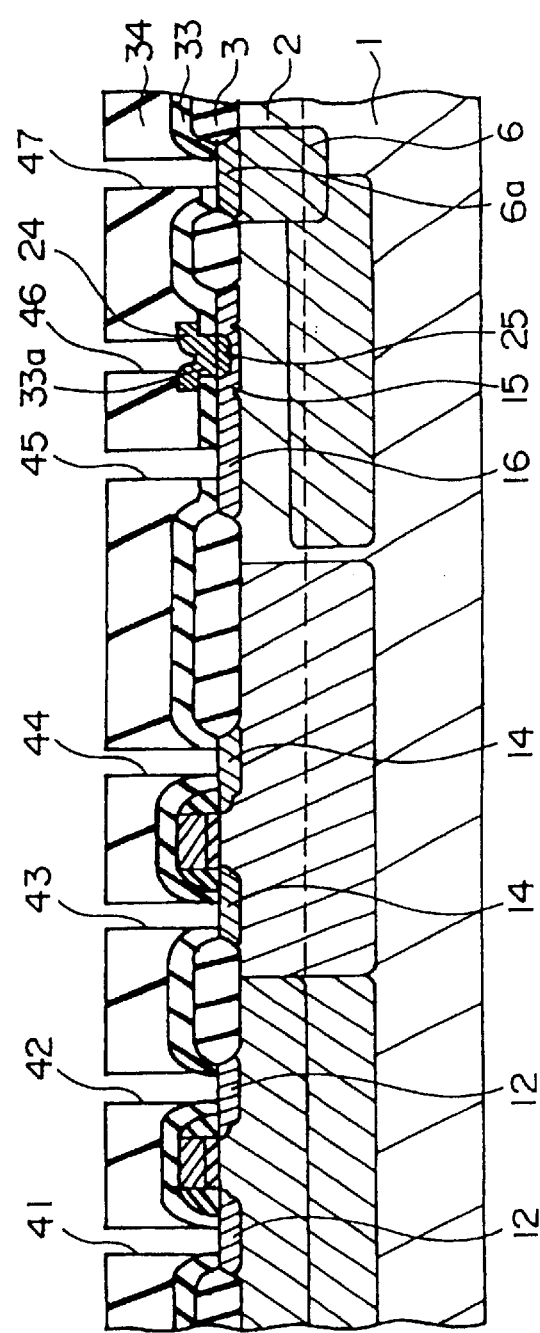

Next, as shown in FIG. 11S, a resist film R10 having openings at the pMOS transistor formation region and an external base region of the npn bipolar transistor is formed by lithography. This is used as a mask for ion implantation of, for example, boron difluoride, as a p-type impurity under the conditions of an ion energy of 35 keV and a dosage of $3\times10^{15}$ atoms/cm$^2$ to form the source/drain regions of the pMOS transistor and the external base region 16 of the npn bipolar transistor.

Next, as shown in FIG. 11T, rapid thermal annealing (RTA) is performed, for example, at 1000° C. for about 10 seconds, so as to activate the impurity introduced to the source/drain regions (12 and 14) of the pMOS and nMOS transistors. Also, due to the heat treatment, the impurities are diffused in the p-type intrinsic base region 15 from the emitter polycrystalline silicon 24 via the opening 32ca of the silicon oxide film 32c to form the n-type emitter region 25.

Next, borophosphosilicate glass (BPSG) is deposited on the entire surface to form an interlayer insulating film 34. This is made flat by reflow in an N$_2$ atmosphere at 900° C. for 20 minutes.

Then, openings (41 and 42) reaching the source/drain regions 12 of the pMOS transistor, openings (43 and 44) reaching the source/drain region 14 of the nMOS transistor, an opening 45 reaching the external base region 16 of the npn bipolar transistor, an opening 46 reaching the emitter polycrystalline silicon 24, and an opening 47 reaching the n-type collector take-out region 6a are formed in the interlayer insulating film 34 and anti-reflection film 35 using a not shown resist film as a mask.

The steps after that comprise depositing, for example, tungsten inside the opening portions (41 to 47) to form not shown tungsten plugs and to form interconnections (51 and 52) connected to the source/drain regions 12 of the pMOS transistor, interconnections (53 and 54) connected to the source/drain regions 14 of the nMOS transistor, an interconnection 55 connected to the external base region 16 of the npn bipolar transistor, an interconnection 56 connected to the emitter polycrystalline silicon 24, and an interconnection 57 connected to the collector take-out region 6a via the tungsten plugs, whereby the semiconductor device shown in FIG. 1 is obtained.

According to the method of production of a semiconductor device of the above embodiment of the present invention, the emitter region for forming an active region of the bipolar transistor and the region between the emitter region and the external base region are covered with the sidewall-use insulating film below the emitter polysilicon at the time of etching for forming the sidewall insulating film, so that it is possible to prevent damage to the base portion of the active region of the bipolar transistor caused by the etching.

Accordingly, in the BiCMOS process, it is possible to prevent the decline of the h$_{FE}$ at a low current caused by an increase of a surface recombination current of the bipolar transistor, so reliability can be improved.

Also, at the time of forming the external base region 16, since the anti-reflection film 35 covers the emitter polycrystalline silicon 24, impurities for forming an external base region are not introduced inside the emitter polycrystalline silicon 24, and the external base region can be formed by self-alignment with respect to the emitter polycrystalline silicon.

Furthermore, by forming the external base region of the bipolar transistor simultaneously with the source/drain regions of the pMOS transistor, the production steps can be reduced.

The present invention is not limited to the above embodiments of the method of production of a semiconductor device. For example, the steps from FIGS. 6J to 7L in the present embodiment may be made by the following steps.

For example, as shown in FIGS. 12J–L, the steps of FIG. 6J and FIG. 7L are performed in one step.

Namely, as shown in FIGS. 12J–L, a resist film R57 having openings at the pMOS transistor region and the intrinsic base formation region of the npn bipolar transistor is formed by lithography. The resist film R57 is used as a mask for ion implantation of, for example, boron difluoride (BF$^{2+}$) as a p-type impurity under the conditions of an ion energy of 24 kev and a dosage of $2\times10^{13}$ atoms/cm$^2$ to form simultaneously the p-type LDD region 11 in the n-type well 7 in the epitaxial layer 2 at the two sides of the gate electrode 22 and the p-type intrinsic base region 15.

Also, by using the resist film 57 as a mask for ion implantation of, for example, arsenic (As$^+$) as an n-type impurity under the conditions of an ion energy of 300 keV and a dosage of $1.5\times10^{13}$ atoms/cm$^2$ to form simultaneously a not shown n-type pocket for forming a part of the n-type well under the p-type LDD region 11 and the SIC region 17 for increasing the concentration of the n-type collector impurity immediately below the intrinsic base region 15.

Next, the resist film R57 is removed; and, as shown in FIG. 12K, the same step as in FIG. 7K is performed.

Namely, a resist R6 having an opening at the nMOS formation region is formed by lithography. The resist film R6 is used as a mask for ion implantation of, for example, arsenic (As$^+$) as an n-type impurity under predetermined conditions to form the n-type LDD region 13 in the p-type well 8 in the epitaxial layer 2 at the two sides of the gate electrode 23.

Also, by successive ion implantation of, for example, boron (B$^+$) as a p-type impurity below the n-type LDD region 13 under predetermined conditions for preventing short channel effects, a not shown p-type pocket for forming part of the p-type well is formed under the n-type LDD region 13.

By successively performing the steps of FIG. 8M and on, the semiconductor device shown in FIG. 1 is obtained.

As a result, the production steps can be reduced by forming simultaneously the pMOS transistor p-type LDD region with the intrinsic base region of the bipolar transistor and the pocket region of the pMOS transistor with the SIC region of the bipolar transistor.

In addition to the above, a variety of modifications can be made within the scope of the present invention.

According to the method of production of a semiconductor device of the present invention, since an emitter region formation insulating film is left below an emitter electrode at the time of forming a sidewall insulating film, sidewall insulating films can be formed on the emitter region as an active region of a first semiconductor element and a semiconductor substrate on the region between the emitter region and the external base region without any damage at the time of forming the sidewall insulating films.

Also, since the external base region can be formed by self-alignment with respect to the emitter electrode and a protective film is formed over the emitter electrode, it is possible to prevent changes in characteristics caused by the introduction of impurities for forming the external base region to the emitter electrode.

Further, in the step of forming an intrinsic base region of a first semiconductor element, an impurity layer for increasing the concentration of the impurity in the collector region under the intrinsic base region, and the external base region, the production steps can be reduced by simultaneously forming a low concentration diffusion layer of a second semiconductor element, a pocket region, and source/drain regions.

Note that the embodiments explained above were described to facilitate the understanding of the present invention and not to limit the present invention. Accordingly, elements disclosed in the above embodiments include all design modifications and equivalents belonging to the technical field of the present invention.

What is claimed is:

1. A method of production of a semiconductor device forming a first semiconductor element comprising a collector region, an emitter region, and an intrinsic base region on a first region and forming a second semiconductor element comprising source/drain regions and a gate electrode on a second region and a sidewall insulating film on side portions of the gate electrode, including the steps of:

forming said collector region on a semiconductor substrate of said first region;

forming said gate electrode on a semiconductor substrate of said second region;

forming said intrinsic base region on said semiconductor substrate of said first region;

forming an insulating film having an opening at an emitter formation region on said intrinsic base region over said semiconductor substrate of said first and second regions;

forming an emitter electrode in said opening and near said opening of said insulating film of said first region;

forming a protective film for suppressing introduction of impurities to said emitter electrode of said first region;

removing said insulating film of said first and second regions while leaving a sidewall insulating film on said gate electrode side portions and emitter region formation insulating film on a part under said emitter electrode by using said emitter electrode as a mask;

forming an external base region connected to said intrinsic base region by self-alignment with respect to said emitter electrode over said semiconductor substrate of said first region;

forming said source/drain regions on said semiconductor substrate of said second region by using said sidewall insulating film as a mask; and forming said emitter region connected to said intrinsic base region on said semiconductor substrate of said first region under said opening by diffusing an impurity in said intrinsic base region from said emitter electrode via said opening of said emitter region formation insulating film.

2. A method of production of a semiconductor device as set forth in claim 1, wherein the step of forming said intrinsic base region comprises forming said intrinsic base region by ion implantation of an impurity to said semiconductor substrate in said first region and forming a diffusion layer of a conductive impurity at a lower concentration than that of a conductive impurity contained in said source/drain regions on said semiconductor substrate of said gate electrode side portion by ion implantation of an impurity to said second region.

3. A method of production of a semiconductor device as set forth in claim 2, further including the steps of:

forming an impurity layer for increasing an impurity concentration of said collector region under said intrinsic base region in said first region after the process of forming said intrinsic base region and before forming said insulating film and forming a pocket region containing a conductive impurity different from the low concentration diffusion layer under said low concentration diffusion layer in said second region in the step of forming the impurity layer.

4. A method of production of a semiconductor device as set forth in claim 1, wherein:

the step of forming said external base region comprises ion implantation of an impurity to said semiconductor substrate in said first region and forming said external base region by self-alignment with respect to said emitter electrode while suppressing implantation of impurities to said emitter electrode by said protective film.

5. A method of production of a semiconductor device as set forth in claim 1, wherein:

the step of forming said external base region and the step of forming said source/drain regions comprise forming said external base region by ion implantation of an impurity to said semiconductor substrate in said first region and forming said source/drain regions by ion implantation of said impurity in said second region.

6. A method of production of a semiconductor device as set forth in claim 1, wherein the step of forming said insulating film includes the steps of forming an insulating film on the entire surface of said semiconductor substrate in said first and second regions;

forming a mask layer having an opening at said emitter formation region on said intrinsic base region in said first region over said insulating film; and removing said insulating film in said opening by using said mask layer as a mask.

7. A method of production of a semiconductor device as set forth in claim 1, wherein:

the step of forming said emitter electrode and the step of forming said protective film includes the steps of forming an emitter-use conductive layer inside said opening of said insulating film and on said insulating film;

forming said protective film on said emitter-use conductive layer; and forming said emitter electrode and said protective film by forming a mask layer on said protective film-use film of a region where said emitter region is to be formed and removing said emitter-use conductive layer and said protective film-use film by using the mask layer as a mask.

8. A method of production of a semiconductor device as set forth in claim 1, wherein the step of forming said emitter electrode comprises forming said emitter electrode by polycrystalline silicon.

9. A method of production of a semiconductor device as set forth in claim 1, wherein the step of forming said protective film comprises forming said protective film by an anti-reflection film.

* * * * *